(12) United States Patent
Yamada et al.

(10) Patent No.: US 6,858,277 B1
(45) Date of Patent: Feb. 22, 2005

(54) INFORMATION RECORDING MEDIUM AND METHOD FOR MANUFACTURING THE SAME

(75) Inventors: Noboru Yamada, Osaka (JP); Rie Kojima, Osaka (JP); Toshiyuki Matsunaga, Osaka (JP); Katsumi Kawahara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/936,601

(22) PCT Filed: Mar. 10, 2000

(86) PCT No.: PCT/JP00/01489
§ 371 (c)(1),
(2), (4) Date: Dec. 13, 2001

(87) PCT Pub. No.: WO00/54982
PCT Pub. Date: Sep. 21, 2000

(30) Foreign Application Priority Data

Mar. 15, 1999 (JP) ............................................ 11-068146
Oct. 15, 1999 (JP) ............................................ 11-293292

(51) Int. Cl.$^7$ .............................. B32B 3/02; G11B 7/24
(52) U.S. Cl. .................... 428/64.1; 428/64.2; 428/64.5; 430/270.13
(58) Field of Search ............................. 428/64.1, 64.2, 428/64.5; 430/270.13; 369/275.4

(56) References Cited

U.S. PATENT DOCUMENTS

| 4,670,345 A | | 6/1987 | Morimoto et al. |
| 5,194,363 A | | 3/1993 | Yoshioka et al. |
| 5,254,832 A | | 10/1993 | Gartner et al. |
| 5,738,927 A | * | 4/1998 | Nakamura et al. ........... 428/141 |
| 5,789,055 A | | 8/1998 | Yoon |
| 6,114,087 A | * | 9/2000 | Goto et al. ............. 430/270.12 |
| 6,115,352 A | * | 9/2000 | Ohno et al. ............... 369/275.4 |
| 6,432,502 B1 | * | 8/2002 | Kitaura et al. .............. 428/64.1 |

FOREIGN PATENT DOCUMENTS

| EP | 387 898 | 9/1990 |
| EP | 874 361 | 10/1998 |
| EP | 898 273 | 2/1999 |
| JP | 1-277338 | 11/1989 |
| JP | 3-42276 | 2/1991 |
| JP | 3-76684 | 4/1991 |
| JP | 4-10979 | 1/1992 |
| JP | 4-69282 | 3/1992 |
| JP | 5-229258 | 9/1993 |
| JP | 6-171234 | 6/1994 |
| JP | 7-214913 | 8/1995 |

OTHER PUBLICATIONS

"High Speed Overwritable Phase Change Optical Disk Material"; Yamada, N. et al.; Japanese Journal of Applied Physics, vol,. 26(1987), Supplement 26–4, p. 61–66.
"Nitrogen Doping Effect on Phase Change Optical Disks", Kojima R. et al., Japanese Journal of Applied Physics, vol.37(1998), Part 1, No.4B, p. 2098–2103.
"Rapid–phase transitions of GeTe–Sb$_2$ pseudobinary amorphous thin films for an optical disk memory", Yamada, N. et al., Journal of Applied Physics, vol. 69 (1991), No. 5, p. 2849–2856.
"Erasable Phase–CHange Optical Materials", Yamada, N., MRS Bulletin vol.21(1996), No.9, p. 48–50.
"Crystal structure of Ge–Sb–Te meta–stable pahse", Nonaka, T. et al., Proceedings of the 10th Symposium on Phase–Change Recording, Nov. 26–27, 1998, Shizuoka, Japan, p. 63–66.

* cited by examiner

Primary Examiner—B. Hamilton Hess
Assistant Examiner—L. Ferguson
(74) Attorney, Agent, or Firm—Merchant & Gould P.C.

(57) ABSTRACT

An information recording medium having such a recording material layer on a substrate where reversible phase change between electrically or optically detectable states can be caused by electric energy or electromagnetic energy. The recording material forming the recording layer is either a material having a crystal structure including lattice defects in one phase of the reversible phase change or a material having a complex phase composed of a crystal portion including a lattice defect in one phase of the reversible phase change and an amorphous portion. Both portions contain a common element. A part of the lattice defects are filled with an element other than the element constituting the crystal structure. The recording medium having a recording thin film exhibits little variation of the recording and reproduction characteristics even after repetition of recording and reproduction, excellent weatherability, strong resistance against composition variation, and easily controllable characteristics.

40 Claims, 10 Drawing Sheets

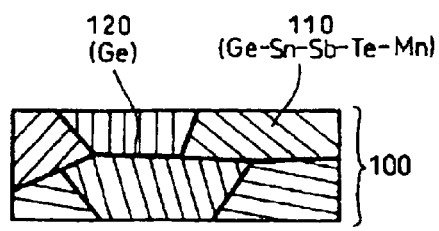 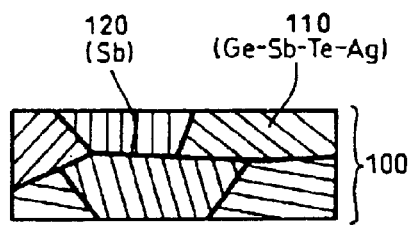
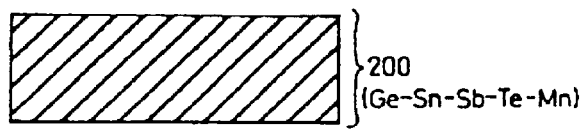 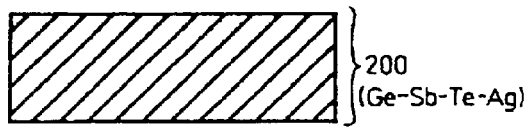
FIG. 3A                FIG. 3B
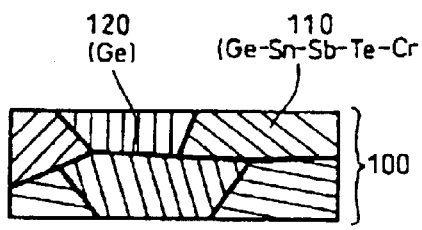 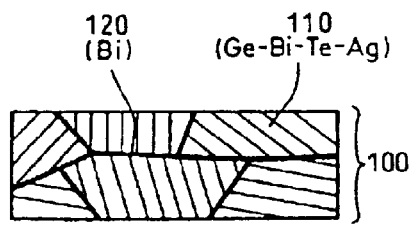
 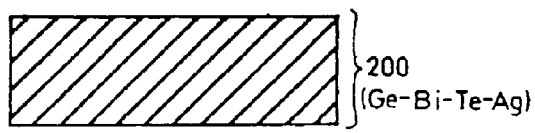
FIG. 3C                FIG. 3D

INFORMATION RECORDING MEDIUM AND METHOD FOR MANUFACTURING THE SAME

TECHNICAL FIELD

The present invention relates to an information recording medium that can record, reproduce, erase and rewrite high-density information by means of irradiation of laser beams and application of a high electric field. The present invention relates to also a method for manufacturing the information recording medium.

BACKGROUND ART

It is well known to apply as a memory a change in optical characteristics caused by reversible phase change of a substance, and a technique using this has come into practice as phase change optical disks such as DVD-RAM. Specifically, recording, reproducing and rewriting of signals will be available by rotating a disk medium comprising a substrate on which a recording thin film for generating reversible phase change is provided, and by irradiating the disk medium with a laser beam drawn to a sub-micron size. In the case of a phase change optical disk, overwriting by means of a single laser beam is carried out. That is, irradiation is performed by modulating the laser power between a high level and a low level depending on the information signal, so that an amorphous phase is generated at a region irradiated with a high power laser beam while a crystalline phase is generated at a region irradiated with a low power laser beam. As a result, a signal array comprising the amorphous portion and crystal portion alternately is recorded on the disk. Since the amorphous portion and the crystal portion are different in the light transmittance and reflectance, the change in the state can be read as a change in the amount of the light transmittance or reflectance by continuously irradiating a laser beam on this signal array, in which the laser beam is attenuated not to change the recording film.

Such a phase change optical disk has some characteristics such as:

(1) it enables the performance of overwriting, i.e., recording a new signal while erasing an old signal by using only one laser beam; and (2) it can record and reproduce a signal by using a change in the reflectance, based on a principle similar to that of a ROM medium. These characteristics lead to several merits such as simplifying a system construction and providing devices for general purposes, so that such phase change optical disks are expected to be applied widely.

Recording materials used for recording layers of phase change optical disks generally include chalcogenide semiconductor thin films based on chalcogen elements such as Te, Se and S. A method used in the early 1970s is crosslinking a T network structure for stabilizing an amorphous state by adding materials such as Ge, Si, As and Sb to a main component of Te. However, these materials would cause a problem. That is, when the crystallization temperature is raised, the crystallization speed is lowered remarkably, and this would make rewriting difficult. Alternatively, when the crystallization speed is increased, the crystallization temperature is lowered sharply, and thus, the amorphous state will be unstable at a room temperature. A technique suggested for solving the problems in the latter half of the 1980s is the application of a stoichiometric compound composition. The thus developed compositions include Ge—Sb—Te based materials, In—Sb—Te based materials, and GeTe based materials. Among them, Ge—Sb—Te based materials have been studied most since the materials allow phase change at high speed, substantially no holes will be formed even after repeated phase changes, and substantially no phase separation or segregation will occur (N. Yamada et al, Jpn. J. Appl. Phys. 26, Suppl. 26-4, 61 (1987)). An example of material compositions other than such stoichiometric compositions is an Ag—In—Sb—Te based material. Though this material is reported to be excellent in the erasing performance, it has been found that the characteristics deteriorate due to the phase separation as a result of repeated overwriting.

Similarly, characteristic deterioration caused by repetition may be observed even if a stoichiometric composition is used. An example of the deterioration mechanism is a phenomenon of micro-scaled mass transfer caused by repetition of overwriting. More specifically, overwriting causes a phenomenon that substances composing a recording film flow little by little in a certain direction. As a result, the film thickness will be uneven at some parts after a big repetition. Techniques to suppress the phenomenon include the addition of additives to recording layers. An example of such techniques is addition of a $N_2$ gas at a time of film formation (JP-A-4-10979). A document clarifies a mechanism that a nitride having a high melting point is deposited like a network in a grain boundary composing the recording film, and this suppresses the flow (R. Kojima et al. Jpn. J. Appl. Phys. 37 Pt. 1, No. 4B. 2098 (1998)).

JP-A-8-127176 suggests a method of including a material having a melting point higher than that of the recording material.

As mentioned later, the cited reference is distinguishable from the present invention in that the material having a high melting point will not be dissolved in the base material but scattered in the base material layer. According to the reference, the scattered material having a high melting point suppresses the mass transfer phenomenon caused by repeated overwriting so as to improve the performance.

JP-A-7-214913 suggests, without clarifying the mechanism, the addition of small amounts of Pt, Au, Cu, and Ni in a Ge—Sb—Te film in order to improve stability of the amorphous phase without lowering the repeatability.

However, the repetition number tends to decrease when the recording density is increased. Due to a recent demand for keeping compatibility among media of various generations, recording at higher density should be performed by using optical heads of identical performance (i.e., laser beams of an identical wavelength and object lenses of an identical numerical aperture). The size of a recording mark should be reduced to raise recording density. On the other hand, the strength of reproduced signals is lowered as the recording mark becomes small, and the signals will be influenced easily by a noise. Namely, during a repeated recording, even a slight variation that may have not caused a trouble in a conventional process will lead to errors in reading, and thus, the number of available repetitions of rewriting is decreased substantially. This problem can be noticeable in the a case of so-called land-groove recording, in which a concave-convex-shaped groove track is formed on a substrate and information is recorded on both the groove (a region closer to the light-incident side) and the land portion (spacing between the grooves) in order to guide a laser beam for recording and reproducing. Specifically, since the thermal and optical conditions are different between the land and groove, the repeatability will deteriorate easily, especially in the land region.

Merits provided by a recording layer comprising a compound material have been described above. On the other hand, when the composition of the recording layer is changed from the stoichiometric composition, the recording performance will be changed remarkably. In a desirable recording method, the performance of a recording film should be controlled with further accuracy while keeping the merit, of the compound composition, and using an identical recording film or a composition having a wide acceptability with respect to characteristics.

Electrical switching devices comprising a chalcogenide material and memory devices are known as well as applications of such phase change materials. The electrical phenomenon was first reported in 1968. Specifically, when voltage is applied gradually to a phase change material thin film in an as-depo.-state sandwiched between electrodes, electrical resistance a between the electrodes sharply declines at a certain threshold voltage, and a large current will start to flow (crystallization). For reversing this state to an initial low-resistant state (OFF state), a big and short current pulse will be passed. A portion provided with current is melted first and then, quenched to be amorphous so that the electrical resistance is increased. Since differences in the electrical resistance can be detected easily by an ordinary electrical means, the material can be used as a rewritable memory. Though material compositions based on Te have been used for electrical memories, any of them require a $\mu s$ order period of time for crystallization.

DISCLOSURE OF THE INVENTION

To solve the above-mentioned problems, a first purpose of the present invention is to provide a phase change memory material that will increase a number of repetitions of rewriting and enables rewriting at a high speed. The memory device can be constituted with either an optical memory or an electric memory. The present invention aims to provide a recording medium comprising a recording thin film formed on a substrate. Due to the above-mentioned excellent characteristics of stoichiometric composition, the recording thin film provides less influence on the characteristics regardless of some composition variation. That is, the recording thin film comprises a composition exhibiting easy controllability of the characteristics. The present invention provides also a method for manufacturing a recording medium comprising such a recording thin film.

For achieving the purposes, an information recording medium according to the present invention comprises a recording material layer formed on a substrate, and the recording material layer enables the generation of reversible phase change by means of electric energy or electromagnetic wave energy in an electrically or optically detectable state. The information recording medium is characterized in that the recording material layer is composed of either a material having a crystal structure including lattice defects in one phase of the reversible phase change (material 'A') or a material in a complex phase comprising lattice defects in one phase of the reversible phase change comprising a crystal portion and an amorphous portion, and both the portions comprise a common element (material 'B'), and that at least one part of the above-mentioned lattice defects is filled with an element other than the elements composing the above-mentioned crystal structure.

Next, a method for manufacturing an information recording medium according to the present invention relates to an information recording medium comprising a recording material layer formed on a substrate, and the recording material layer generates reversible phase change by means of electric energy or electromagnetic wave energy in an electrically or optically detectable state. It is characterized in that the recording layer is constituted with a recording material having a crystal structure in which one phase of the reversible phase change includes lattice defects, and that at least a part of the defects is filled with additional elements.

The present invention employs the following material compositions for generating reversible phase change between an amorphous phase and a crystalline phase by irradiating the material layer with a laser beam or energizing the same layer. The material composition forms a single phase during crystallization and the crystal lattice necessarily includes some defects. At least a part of the lattice defects is filled with an element other than the element composing the base material in order to exhibit a new compound phase that has never been observed. Filling additional elements in the lattice of the base material can change the characteristics of the base material fundamentally.

For solving the above-mentioned problems, the present invention employs an amorphous material layer to be crystallized by irradiating a laser beam or by energizing. The material phase forms a complex phase (crystalline phase) comprising a compound phase portion having lattice defects within the crystal and an amorphous phase portion. Here, it is important and preferred that the compound phase portion is filled with additional elements, and the amorphous phase is a single phase. It is preferable that a molar ratio of the amorphous phase to the crystalline phase in the complex phase is 2.0 at most, and further preferably, the ratio is 1.0 at most.

Regardless whether the crystalline phase is a single phase or a complex phase, it is preferable that the compound comprises a base material of rock-salt type structure (NaCl) having a crystal structure with a lattice defect (vacancy). As mentioned above, at least one part of the lattice defects included in the base material is filled with an atom other than elements composing basic substances of the rock-salt type structure. It is preferable for the element to fill the lattice defects that Rim is closer to Rnc, e.g., $0.7 < Rim \leq 1.05$ Rnc, where Rim denotes an ionic radius of an element to fill the lattice defects, and Rnc denotes an ionic radius of a smallest ion among elements composing the rock-salt type crystal. When Tim denotes a melting point of an element to fill the lattice defects and Tnc denotes a melting point of the rock-salt type crystal, it is preferable that the Tim is closer to Tnc, i.e., the relationship satisfies $|Tim-Tnc| \leq 100°$ C. When Dim denotes a concentration of an element added to fill the lattice defects and Ddf denotes a concentration of the lattice defects in the rock-salt type crystal, it is preferable that $Dim \leq Ddf \times 1.5$. It is further preferable that $0.2 \leq Dim \leq Ddf$.

Specifically, the material is preferred to contain Te. A substance to form the amorphous phase in the complex phase comprises at least one of Sb, Bi, In, Ge and Si. At least a part of the elements can comprise an oxide, a nitride, a fluoride, and a nitride-oxide. It should be noted here that the compound phase and the amorphous phase preferably contain a common element. For example, when an element composing the crystalline phase is based on three elements of Ge, Sb and, the amorphous phase is preferred to contain Sb or Ge as a main component. Alternatively, it is further preferable that the compound phase contains Ge. Sb and/or Bi and Te while the amorphous phase contains Sb and/or Bi or Ge. It is preferable that at least one element selected from Sn, Cr, Mn, Pb, Ag, Al, In, Se and Mo is included in the crystalline phase.

The element composing the rock-salt type crystal preferably contains Ge and Te as its base materials, and further preferably it contains at least one element selected from Sb and Bi. It is particularly preferable that the base material composition of the rock-salt type crystal substantially corresponds to a GeTe—$Sb_2Te_3$ quasibinary system composition, a GeTe—$Bi_2Te_3$ quasibinary system composition or a mixture thereof. When an element composing the rock-salt type crystal contains Ge, Te, and Sb, or it contains Ge, Te, and Bi, the element to fill the lattice defects is at least one selected from Al, Ag, Pb, Sn, Cr, Mn And Mo. It is also preferable that the base material composition of the rock-salt type crystal substantially corresponds with $(GeTe)_{1-x}(M_2Te_3)_x$, in which $0.2 \leq x \leq 0.9$ (M denotes at least one element selected from Sb. Bi and Al, or an arbitrary mixture of these elements). It is further preferable that $0.5 \leq x \leq 0.9$. For improving recording sensitivity, it is further preferable that the recording film contains nitrogen (N) or oxygen (O). Preferably, the concentration of the N atom (Dn) is 0.5 atom $\% \leq Dn \leq 5$ atom $\%$ since the range provides higher effects.

Filling Al, Cr or Mn in lattices is preferable to improve repeatability, and addition of Ag is preferable to increase changes in optical characteristics (signal amplitude change) between the crystalline phase and the amorphous phase. Filling Sn or Pb is effective in improving crystallization speed.

It is further effective to fill plural elements at the same time in lattice defects for improving the characteristics. When the material is based on Ge—Sb—Te or Ge—Bi—Te, both the crystallization speed and the repeatability can be improved preferably at the same time by, for example, using simultaneously at least one of Sn and Pb together with Al, Cr or Mn. Otherwise, simultaneous use of either Sn or Pb together with Ag is preferable to improve the crystallization speed and the signal amplitude at the same time. Using at least one of Al, Cr and Mn together with Ag is preferable to improve at repeatability and signal amplitude at the same time. Furthermore, addition of at least one of Al, Cr and Mn, at least either Sn or Pn together with Ag is preferable in improving crystallization speed, signal amplitude and repeatability at the same time.

Preferably, such a material layer is manufactured by lamination such as vapor deposition and sputtering. Specifically, it is further preferable that sputtering is carried out by using a target including a component composing the rock-salt type crystal and an element to fill the lattice defects. Preferably, the target contains at least Ge and Te as elements for forming the rock-salt type crystal, and further preferably, contains an element selected from Al, Sb and Bi. Especially preferable elements to fill the lattice defects include Ag, Sn, Pb, Al, Cr, In, Mn and Mo. It is further preferable that sputtering is carried out in a gaseous atmosphere containing Ar and $N_2$. It is also preferable that the sputtering gas contains at least one gas selected from $N_2$ gas and $O_2$ gas.

An optical information recording medium according to the present invention can comprise a single layer medium prepared by forming the above-mentioned recording material thin film on a substrate. However, it is desirable to use a multilayer including the recording layer. For example, it is preferable that a protective layer is provided between the substrate and the recording layer in order to reduce thermal damage in the substrate or to utilize its optical interference effect. It is also preferable to provide a protective layer to the opposing surface of the recording layer as well in order to prevent deformation of the recording layer and to utilize its optical interference effect. The protective layer is made of a material that is stable thermally and chemically, and transparent optically, such as an oxide, a sulfide, a nitride, a nitride-oxide, a carbide, and fluoride. Examples of the materials include ZnS, $SiO_2$, ZnS—$SiO_2$, SINO, SiN, SiC, GeN, $C_2O_3$, and $Al_2O_3$. It is preferable to provide a reflecting layer over the protective layer in order to increase efficiency for laser beams or the like used for recording. The reflecting layer can be a metallic material film or a multilayer film combined with a dielectric material. The metallic material can be Au, Al, Ag or an alloy based on these metals.

An electric information recording medium according to the present invention can be constituted by laminating sequentially on a substrate an electrode material, the above-mentioned material thin film, and a further electrode material. Otherwise, such a medium can be constituted by laminating the material thin film and an electrode material on a metallic substrate that functions also as an electrode.

Materials of the respective layers are formed by lamination such as sputtering and vapor deposition similar to the case of an optical information recording medium. Since an electric memory system in the present invention causes variation in electrical resistance, it can be used as a component for a variable programmable circuit.

BRIEF DESCRIPTION OF DRAWINGS

In FIG. 2, (a) denotes a crystalline phase 100. The crystalline phase is a complex phase (mixture phase) 100 comprising a component 110 having a compound structure basically equal to that shown in FIG. 1 and also an amorphous component 120. In FIG. 2, (b) denotes an amorphous phase 200. In (b), a single phase is formed.

FIGS. 3A–3D are further specific examples of the structure shown in FIG. 2.

In FIGS. 4A–4J, 7 denotes a substrate, 8 denotes a recording layer (phase change material layer), and 9 and 10 denote protective layers. Numeral 11 denotes a reflective layer, 12 denotes an overcoat layer, 13 denotes an adhesive layer, and 14 denotes a protective plate. Numeral 15 denotes a surface layer, 16 and 17 denote interface layers, 18 denotes an optical absorption layer, 19 denotes a reflective layer (light incident side), and 20 and 21 respectively denote multilayer films of the above-mentioned thin films.

FIG. 6A shows the recording performance regarding a 3T pulse. FIG. 6B shows the recording performance regarding a 4T pulse, and FIG. 6C shows the recording performance regarding 5T–11T pulses.

FIG. 7 is a graph to show a relationship between a proper additive concentration and a lattice defect concentration in an information recording medium according to the present invention.

In FIG. 10, 23 denotes a substrate, 24 and 27 denote electrodes, 25 denotes an insulator, 26 denotes a phase change material film, 28 and 29 denote switches, 30 denotes a pulse power source, and 31 denotes an electrical resistance meter.

BEST MODE FOR CARRYING OUT THE INVENTION

Figure 1:
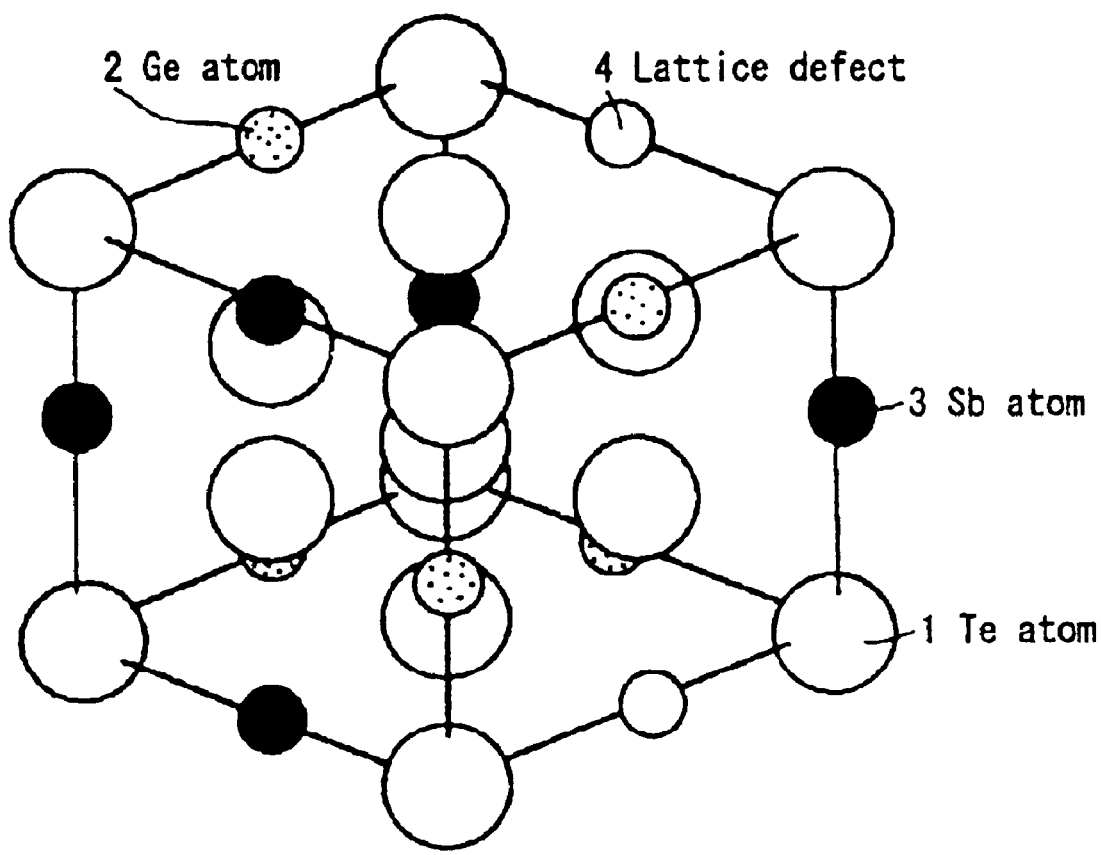
FIG. 1 is a schematic view to show a structure (atom position at a time of crystallization) of a representative recording film used for an information recording medium of the present invention, in which the crystalline phase is a single phase. In this example, the crystalline phase is constituted with a single compound phase (moreover, it is a rock-salt type structure). In the lattice site position forming the rock-salt type structure, all 4a sites are occupied by Te atoms 1, while 4b sites are occupied by Ge atoms 2, Sb atoms 3, and occupied randomly by also lattice defects 4. In the present invention, atoms other than the atoms occupying the 4b sites are filled in the lattice defects.

FIG. 4 is a cross sectional view to show an example (layer constitution) of an optical information recording medium according to the present invention. A typical information recording medium is constituted by forming a recording layer 8 having the above-mentioned constitution on a substrate 7 selected from transparent polycarbonate resin, an acrylic resin, a polyolefin-based resin, a glass sheet or the like. Protective layers 9 and 10 can be formed on at least one surface of the recording layer. Reflective layers 11 can be formed on the respective protective layers. Overcoats 12 can be formed on the top layers, or the overcoats can be replaced by protective plates 14 that are adhered by adhesive layers 13. For guiding laser beams used in recording/reproducing, a spiral or concentric circular concave-convex groove track, a pit array, a track address can be formed on the substrate surface. Such a recording medium is irradiated with a laser beam in order to cause reversible phase change in the recording layer between a crystalline phase and an amorphous phase, so that information can be rewritten. In the case of crystallization, the recording medium is irradiated with a laser beam like a pulse in order to keep the irradiated part at or above an interim crystallization change temperature. In changing the recording layer to be amorphous, the layer is irradiated with a more intensive laser beam for a period equal to or shorter when compared to a case of crystallization, so that the irradiated part is melted instantaneously and then quenched. This reversible phase change can be detected as a change in the reflectance or transmittance. This reproduction is carried out by irradiating the recording medium with a laser beam weakened not to provide any additional influence so as to detect changes in the strength of light reflected from the irradiated portion or transmitted.

An optical information recording medium according to the present invention, as shown in FIGS. 4A–4J, will be characterized by a composition of a material composing the recording layer 8 and by the internal structure. A representative example will be explained below with reference to a Ge—Sb—Te based material. As reported in N. Yamada et al., J. Appl. Phy. 69(5), 2849 (1991), a Ge—Sb—Te material is crystallized to have a face-centered cubic structure metastably by irradiating a laser beam. In addition to that, a recent research presentation by the same author (MRS-Buttetin, 21(9), 48(1996) and a research presentation by Nonaka et al. (papers for the tenth symposium on phase change recording, p.63) suggest that the metastable phase necessarily contains many lattice defects (vacancy). The following description is about a representative composition of a stoichiometric compound composition of $Ge_2Sb_2Te_5$. The material has a metastable phase of rock-salt type (NaCl type). As shown in FIG. 1, all lattice positions (4a sites) corresponding to Cl atoms are occupied by Te atoms 1, and all lattice site positions (4b sites) corresponding to Na atoms are occupied by Ge atoms 2 and Sb atoms 3 at random depending on the composition ratio. However, since the total number of the Ge atoms and the Sb atoms is greater than the number of the Te atoms, the 4b sites necessarily has lattice defects 4 of about 20% (about 10% of the entire sites). The lattice defects also are located at random (An example of atom positions in 4a sites is shown).

The inventors reported that such a Ge—Sb—Te system makes a crystal having a substantially identical face-centered-cubic crystal structure even if the composition is changed. Recent studies show that a Sb atom does not enter a crystal lattice but an added Sb atom exists in a separate structure on an interface of a crystal particle even if Sb is included in a form of, e.g., $Ge_2Sb_{2+x}Te_5$ ($0<x\leq1$) to fill the defects. Particularly, the Sb atom will exist in an amorphous phase especially for a case of laser crystallization. Specifically, the result of observation by a detailed X-ray diffraction demonstrates that even if Sb is added to a stoichiometric composition $Ge_2Sb_2 e_5$ thin film, the Sb atom does not enter the crystal lattice to fill the lattice defect completely. As a result, $Ge_2Sb_2Te_5$ crystal and Sb will coexist in a structure of a recording film in a crystalline state. In a typical case of two-phase coexistent composition, repetition of a melting-solidification process will cause a phase separation, and this will lead to local variation in the composition. An advantage of this case is that such a phase separation will not proceed since the melting point of Sb is considerably close to that of Ge—Sb—Te and since the Ge—Sb—Te also includes Sb.

Besides Sb, some additives On prevent crystal growth though the conditions vary in many cases. For example, JP-A-7-214913 discloses the addition of Pd. This reference discloses that crystallization becomes difficult when the amount of the additives exceeds 2 atom %. From the fact that a very small amount of additive causes an abrupt change in the characteristics, Pd is considered to exist without entering the lattice defects. In other words, even a small amount of Pd is considered to be separated completely from Ge—Sb—Te hut not to enter a crystal lattice based on Ge—Sb—Te. However, when the Pd concentration reaches about 2 atom %, characteristics of Pd as a material having a high-melting point become remarkable, and the Pd will restrict the movement of atoms so as to substantially prevent crystallization. Moreover, repetition of recording and erasing accelerates phase separation of the Ge—Sb—Te and Pd. In other words, an additive that does not enter a lattice cannot be suitable for controlling the characteristics.

On the other hand, a relatively easy relationship between Sb concentration and change in the crystallization characteristics facilitates control of the characteristics and serves to maintain high repeatability. This fact may suggest that the melting point of an additional element cannot be too much higher than that of the base material in order to change the characteristics widely and continuously by adding the element. It is also desirable that the additional element can enter the crystal lattice and especially, the element does not create a separate crystalline phase. A further merit is that entering of excessive and harmful atoms can be prevented by previously filling the lattice defects with useful atoms.

The inventors evaluated recording materials from the above-mentioned aspects and found that additional elements enter crystal lattices and thus characteristics can be controlled continuously with high accuracy under a certain condition. The inventors found also that some additives will take place of elements of the base material. Moreover, the additives may change the purged elements. In addition, the temperature and speed of crystallization can be controlled by controlling the condition and concentration of the purged elements, and this will lead to desirable recording/erasing performance. It is reasonable that in this case, a part of elements forming a compound in a crystal is common to elements that have been purged outside the compound and exist in an amorphous phase in the grain boundary or the like. This means that positional uniformity of the composition will be maintained easily all the time that phase changes between a crystalline phase and an amorphous phase occur. Specifically, the additives prevent the progress of phase separation even when the crystalline phase becomes a complex phase, and thus, good repeatability can be maintained. It can be concluded from the above facts that a material being a single phase and necessarily including lattice defects can provide unexpected characteristics by filling the lattice defects appropriately with any other atoms. Also, it is suggested that addition of a certain element can help formation of a material having a new structure.

The following explanation is about a specific material composition to constitute a recording layer 8. A primary condition for a material in the present invention is to obtain a material comprising many lattice defects. A crystalline phase comprising lattice defects will appear as a metastable phase in materials that can be represented by GeTe—$M_2Te_3$ (M is, for example, Sb, Bi or Al). The examples are a Ge—Sb—Te based material comprising a GeTe—$Sb_2Te_3$ composition, a Ge—Bi—Te material comprising a GeTe—$Bi_2Te_3$ based composition, or a Ge—Te—Al based material comprising a GeTe—$Al_2Te_3$ based composition. Similarly, a crystalline phase including lattice defects will appear as a metastable phase in composition of the mixtures such as Ge—Sb—Bi—Te, Ge—Sb—Al—Te, Ge—Bi—Al—Te, and Ge—Sb—Bi—Al—Te. Similar constitutions are obtained for Ge(Te,Se)—$M_2(Te,Se)_3$ in which a part of Te is replaced by Se. The examples are Ge—Te—Se—Sb, Ge—Te—Se—Bi, Ge—Te—Se—Sb—Bi, Ge—Te—Se—Al, Ge—Te—Se—Sb—Al, Ge—Te—Se—Bi—Al, and Ge—Te—Se—Sb—Bi—Al. Similar effects were obtained by applying, for example, Ge—Sn—Te—Sb, Ge—Sn—Te—Sb—Al, Ge—Pb—Te—Sb, and Ge—Pb—Te—Sb—Al, which are obtained by substituting a part of the Ge with Sn or with Pb. Similar constitutions were obtained when N was added to the compositions. These are crystallized metastably to have a face-centered-cubic crystal structure (rock-salt structure). When the 4b sites of the rock-salt type structure are occupied by. Te (or Se) and the 4a sites are occupied by other element M as mentioned above, Tb (or Se) atoms outnumber M atoms, with will create lattice defects at the 4a sites inevitably. The lattice defects cannot be filled completely with the above-mentioned elements such as Sb. The reason has not been clarified yet, but it can be deduced that a metastable phase of a rock-salt type cannot be formed without a certain number of lattice defects inside thereof. Namely, filling the defects may raise the entire energy so that the rock-salt type structure cannot be kept.

As a result of various analyses and experiments, the inventors have found that not all elements can fill lattice defects and that an ionic radius is an important factor to determine the conditions. When the 4a sites have lattice defects, the defected lattices of the base materials will be filled easily if Rim is sufficiently close to Rnc, where Rnc denotes an ionic radius of an element having a minimum ionic radius among elements occupying the 4a sites and Rim denotes an ionic radius of an additional element. According to Third Revision of Manual of Basic Chemistry (Kagaku-binran Kiso-hen) II issued by Maruzen Co., Ltd., the radius of a $Ge^{4+}$ ion is 0.67 nm, the radius of a $Sb^{5+}$ ion is 0.74 nm, and the radius of a $Te^{2-}$ ion is 2.07 nm when the coordination number is 6. For Ge—Sb—Te, an element can enter a lattice easily when it has an ionic radius substantially the same or slightly smaller than the radius of a Ge ion located at a 4b site. Each Ge ion has a smaller ionic radius than that of a Sb ion.

TABLE 1

Ionic radii and element's melting points for respective ion species

| No. | Ion species with a coordination number of 6 | Ionic radius (nm) | Element's melting point (° C.) |
|---|---|---|---|
| 1 | $N^{5+}$ | 2.7 | −209.86 |
| 2 | $V^{5+}$ | 5.0 | 1890 |
| 3 | $S^{4+}$ | 5.1 | 112.8 |
| 4 | $Si^{4+}$ | 5.4 | 1410 |
| 5 | $P^{3+}$ | 5.8 | 44.1 |
| 6 | $Be^{2+}$ | 5.9 | 1280 |
| 7 | $As^{5+}$ | 6.0 | 817 |
| 8 | $Se^{4+}$ | 6.4 | 217 |
| 9 | $Ge^{4+}$ | 6.7 | 937.4 |
| 10 | $Mn^{4+}$ | 6.7 | 1240 |
| 11 | $Be^{7+}$ | 6.7 | 3180 |
| 12 | $Al^{3+}$ | 6.8 | 660.37 |
| 13 | $Co^{3+1}$ | 6.9 | 1490 |
| 14 | $Fe^{3+1}$ | 6.9 | 1540 |
| 15 | $Cr^{4+}$ | 6.9 | 1860 |
| 16 | $Be^{6+}$ | 6.9 | 3180 |
| 17 | $Te^{6+}$ | 7.0 | 449.5 |
| 18 | $Ni^{3+1}$ | 7.0 | 1450 |
| 19 | $As^{3+}$ | 7.2 | 817 |
| 20 | $Mn^{3+1}$ | 7.2 | 1240 |
| 21 | $V^{4+}$ | 7.2 | 1890 |
| 22 | $Mo^{6+}$ | 7.3 | 2620 |
| 23 | $Sb^{5+}$ | 7.4 | 630.74 |
| 24 | $Ni^{3+h}$ | 7.4 | 1450 |
| 25 | $Rh^{4+}$ | 7.4 | 1970 |
| 26 | $W^{6+}$ | 7.4 | 3400 |
| 27 | $Co^{3+h}$ | 7.5 | 1490 |
| 28 | $Fe^{2+1}$ | 7.5 | 1540 |
| 29 | $Ti^{4+}$ | 7.5 | 1660 |
| 30 | $Mo^{5+}$ | 7.5 | 2620 |
| 31 | $Ga^{3+}$ | 7.6 | 29.78 |
| 32 | $Pd^{4+}$ | 7.6 | 1550 |
| 33 | $Cr^{3+}$ | 7.6 | 1860 |
| 34 | $Ru^{4+}$ | 7.6 | 2310 |
| 35 | $W^{5+}$ | 7.6 | 3400 |
| 36 | $Pt^{4+}$ | 7.7 | 1770 |
| 37 | $Ir^{4+}$ | 7.7 | 2410 |
| 38 | $Os^{4+}$ | 7.7 | 3045 |
| 39 | $V^{3+}$ | 7.8 | 1890 |
| 40 | $Nb^{5+}$ | 7.8 | 2470 |
| 41 | $Ta^{5-}$ | 7.8 | 2990 |
| 42 | $Mn^{3+h}$ | 7.9 | 1240 |
| 43 | $Co^{2+1}$ | 7.9 | 1490 |
| 44 | $Fe^{3+h}$ | 7.9 | 1540 |
| 45 | $Te^{4-}$ | 7.9 | 2170 |
| 46 | $Mo^{4-}$ | 7.9 | 2620 |
| 47 | $W^{4+}$ | 8.0 | 3400 |
| 48 | $Mn^{2+1}$ | 8.1 | 1240 |
| 49 | $Ti^{3+}$ | 8.1 | 1660 |

TABLE 1-continued

Ionic radii and element's melting points for respective ion species

| No. | Ion species with a coordination number of 6 | Ionic radius (nm) | Element's melting point (° C.) |
|---|---|---|---|
| 50 | $Rh^{3+}$ | 8.1 | 1970 |
| 51 | $Ru^{3+}$ | 8.2 | 2310 |
| 52 | $Ir^{3+}$ | 8.2 | 2410 |
| 53 | $Nb^{4+}$ | 8.2 | 2470 |
| 54 | $Ta^{4+}$ | 8.2 | 2990 |
| 55 | $Sn^{4+}$ | 8.3 | 231.96 |
| 56 | $Ni^{2-}$ | 8.3 | 1450 |
| 57 | $Mo^{3-}$ | 8.3 | 2620 |
| 58 | $Bf^{4+}$ | 8.5 | 2230 |
| 59 | $Mg^{2+}$ | 8.6 | 648.8 |
| 60 | $Zr^{4+}$ | 8.6 | 1850 |
| 61 | $Nb^{3+}$ | 8.6 | 2470 |
| 62 | $Ta^{3+}$ | 8.6 | 2990 |
| 63 | $Ge^{2+}$ | 8.7 | 937.4 |
| 64 | $Cu^{2+}$ | 8.7 | 1083.4 |
| 65 | $U^{5+}$ | 8.7 | 1132.3 |
| 66 | $Cr^{2+1}$ | 8.7 | 1860 |
| 67 | $Zn^{2+}$ | 8.8 | 419.58 |
| 68 | $Sc^{3+}$ | 8.8 | 1540 |
| 69 | $Co^{2+h}$ | 8.9 | 1490 |
| 70 | $Li^+$ | 9.0 | 180.54 |
| 71 | $Bi^{6+}$ | 9.0 | 271.3 |
| 72 | $Sb^{3+}$ | 9.0 | 630.74 |
| 73 | $Pd^{3+}$ | 9.0 | 1550 |
| 74 | $Cu^+$ | 9.1 | 1083.4 |
| 75 | $Pb^{4+}$ | 9.2 | 327.502 |
| 76 | $Fe^{2+h}$ | 9.2 | 1540 |
| 77 | $V^{2+}$ | 9.3 | 1890 |
| 78 | $In^{3+}$ | 9.4 | 156.61 |
| 79 | $Pt^{2+}$ | 9.4 | 1770 |
| 80 | $Cr^{2+h}$ | 9.4 | 1880 |

Atoms in a rock-salt structure are considered to have a coordination number of 6. Table 1 is a list of ion species each having a coordination number of 6 and ionic radius of about 0.67 nm in an order of the ionic radius. Since a $Ge^{4+}$ ion has ionic radius of 0.67 nm, ions ranging from a vanadium ion $V^{5+}$ that is about 70% of a $Ge^{4+}$ ion to a $Ni^{3+}$ ion that is about 105% may enter a lattice. That is, effective elements are V, S, Si, P, Be, As, Se, Ge, Mn, Re, Al, Co, Te, Cr, and Ni. Among them, V, S, Si, Mn, Al, Co, Cr, and Ni etc. are suitable. The remaining elements are not suitable, since, for example, Be, As and P may cause problems due to the toxicity, while Ge and Te compose the base material, and Re is a radioactive element.

Elements for filling lattices are not limited to the above-mentioned ones. The above-mentioned condition is just one factor to determine easy access to a lattice. An element that composes a compound of a rock-salt type structure is observed to enter a lattice easily. Specifically, Ag, Sn and Pb were observed entering lattices, since Ag, Sn and Pb compose $AgSbTe_2$, SnTe, and PbTe respectively.

In addition to the suitability to fill a lattice, another important factor for additional elements is the melting point. Formation of an amorphous mark with a phase change optical disk requires a process of melting a recording film before quenching. For such a case, a melting point of the additive is preferred to be close to the melting point of an entire recording film (more preferably, a melting point of the additive is close to melting points of all elements composing the recording film). If the additive has a melting point much higher than the entire melting point, phase separation will proceed easily during repetition of melting and solidification. In such a case, it is difficult to keep the additives stably in lattices even when the ionic radii are closer to each other. In other words, phase separation occurs, and the phase separation creates a region comprising more additives and a region comprising fewer additives. It is preferable to decrease the difference between the melting points, however, when the difference is about 100° C., lattice defects can be filled while creating substantially no phase separation. Otherwise an extremely uniform mixed phase can be formed even without forming a single phase. For a case of $Ge_2Sb_2Te_5$ the melting point is about 630° C. Therefore, an additive is preferred to have a melting point in a range from about 530° C. to 730° C. Table 2 is a list of elements to form ions having coordination number of 6 as mentioned above, and the elements are described sequentially from the one with a lower melting point. This table shows that elements ranging from No. 25 (Sb) to No. 31 (Ba) are within the range. That is, corresponding elements are Sb, Pu, Mg, Al and Ba, from which Pu as a radioactive element and Sb as a base material are excluded. The remaining Mg, Al, Ba or the like are used suitably for the purpose.

TABLE 2

Melting points of respective elements and ionic radii of ion species

| No. | Ion species with a coordination number of 6 | Ionic radius (nm) | Element's melting point (° C.) |
|---|---|---|---|
| 1 | $Cs^+$ | 18.1 | 28.4 |
| 2 | $Ga^{3+}$ | 7.6 | 29.78 |
| 3 | $Rb^+$ | 16.6 | 38.89 |
| 4 | $P^{3+}$ | 5.8 | 44.1 |
| 5 | $K^+$ | 15.2 | 63.65 |
| 6 | $Na^+$ | 11.6 | 97.81 |
| 7 | $S^{2-}$ | 17.0 | 112.8 |
| 8 | $S^{4+}$ | 5.1 | 112.8 |
| 9 | $I^-$ | 20.6 | 113.5 |
| 10 | $In^{3+}$ | 9.4 | 156.61 |
| 11 | $Li^+$ | 9.0 | 180.54 |
| 12 | $Se^{2-}$ | 18.4 | 217 |
| 13 | $Se^{4+}$ | 6.4 | 217 |
| 14 | $Sn^{4+}$ | 8.3 | 231.96 |
| 15 | $Bi^{3+}$ | 11.7 | 271.3 |
| 16 | $Bi^{6-}$ | 9.0 | 271.3 |
| 17 | $Tl^+$ | 16.4 | 303.5 |
| 18 | $Tl^{3+}$ | 10.3 | 303.5 |
| 19 | $Cd^{2+}$ | 10.9 | 320.9 |
| 20 | $Pb^{2+}$ | 13.3 | 327.502 |
| 21 | $Pb^{4+}$ | 9.2 | 327.502 |
| 22 | $Zn^{2+}$ | 8.8 | 419.58 |
| 23 | $Te^{2-}$ | 20.7 | 449.5 |
| 24 | $Te^{6+}$ | 7.0 | 449.5 |
| 25 | $Sb^{3+}$ | 9.0 | 630.74 |
| 26 | $Sb^{5+}$ | 7.4 | 630.74 |
| 27 | $Pu^{3+}$ | 11.4 | 639.5 |
| 28 | $Pu^{4+}$ | 10.0 | 639.5 |
| 29 | $Mg^{2+}$ | 8.6 | 648.8 |
| 30 | $Al^{3+}$ | 6.8 | 660.37 |
| 31 | $Ba^{2+}$ | 14.9 | 725 |
| 32 | $Sr^{2+}$ | 13.2 | 769 |
| 33 | $Ce^{3+}$ | 11.5 | 799 |
| 34 | $Ce^{4+}$ | 10.9 | 799 |
| 35 | $As^{3+}$ | 7.2 | 817 |
| 36 | $As^{5+}$ | 6.0 | 817 |
| 37 | $Eu^{2+}$ | 13.1 | 822 |
| 38 | $Eu^{3+}$ | 10.9 | 822 |
| 39 | $Ca^{2+}$ | 11.4 | 839 |
| 40 | $La^{3+}$ | 11.7 | 921 |
| 41 | $Ge^{2+}$ | 8.7 | 937.4 |
| 42 | $Ge^{4+}$ | 8.7 | 937.4 |
| 43 | $Ag^+$ | 12.9 | 961.93 |
| 44 | $Ag^{2+}$ | 10.8 | 961.93 |
| 45 | $Nd^{3+}$ | 11.2 | 1020 |
| 46 | $Ac^{3+}$ | 12.6 | 1050 |
| 47 | $Au^+$ | 15.1 | 1064.43 |

TABLE 2-continued

Melting points of respective elements and ionic radii of ion species

| No. | Ion species with a coordination number of 6 | Ionic radius (nm) | Element's melting point (° C.) |
|---|---|---|---|
| 48 | $Cu^+$ | 9.1 | 1083.4 |
| 49 | $Cu^{2+}$ | 8.7 | 1083.4 |
| 50 | $U^{3+}$ | 11.7 | 1132.3 |
| 51 | $U^{4+}$ | 10.3 | 1132.3 |
| 52 | $U^{5+}$ | 8.7 | 1132.3 |
| 53 | $Mn^{2+l}$ | 8.1 | 1240 |
| 54 | $Mn^{2+h}$ | 9.7 | 1240 |
| 55 | $Mn^{3+l}$ | 7.2 | 1240 |
| 56 | $Mn^{3+h}$ | 7.9 | 1240 |
| 57 | $Mn^{4+}$ | 6.7 | 1240 |
| 58 | $Be^{2+}$ | 5.9 | 1280 |
| 59 | $Gd^{3+}$ | 10.8 | 1310 |
| 60 | $Dy^{3+}$ | 10.5 | 1410 |
| 61 | $Si^{4+}$ | 5.4 | 1410 |
| 62 | $Ni^{2+}$ | 8.3 | 1450 |
| 63 | $Ni^{3+l}$ | 7.0 | 1450 |
| 64 | $Ni^{3+h}$ | 7.4 | 1450 |
| 65 | $Co^{2+l}$ | 7.9 | 1490 |
| 66 | $Co^{2+h}$ | 8.9 | 1490 |
| 67 | $Co^{3+l}$ | 6.9 | 1490 |
| 68 | $Co^{3+h}$ | 7.5 | 1490 |
| 69 | $Y^{3+}$ | 10.4 | 1520 |
| 70 | $Sc^{3+}$ | 8.8 | 1540 |
| 71 | $Fe^{2+l}$ | 7.5 | 1540 |
| 72 | $Fe^{2+h}$ | 9.2 | 1540 |
| 73 | $Fe^{3+l}$ | 6.9 | 1540 |
| 74 | $Fe^{3+h}$ | 7.9 | 1540 |
| 75 | $Pd^{2+}$ | 10.0 | 1550 |
| 76 | $Pd^{3+}$ | 9.0 | 1550 |
| 77 | $Pd^{4+}$ | 7.6 | 1550 |
| 78 | $Lu^{3+}$ | 10.0 | 1660 |
| 79 | $Ti^{2+}$ | 10.0 | 1660 |
| 80 | $Ti^{3+}$ | 8.1 | 1660 |

For example, when the base material comprises a $Ge_2Sb_2Te_5$ composition, Al is a suitable element that can satisfy the two conditions concerning ion radius and melting point simultaneously, while it is free of toxicity or radioactivity. A GeTe—Sb, $Te_3$-based composition can be treated in the same manner as $Ge_2Sb_2Te_5$. While the melting point of the GeTe—$Sb_2Te_3$-based composition changes continuously in a range from 593° C. to 725° C., Al was effective as well in filling lattice defects. Similarly, in any material compositions based on Ge and Te, Al was effective in filling lattice defects. Needless to say, elements other than Al were confirmed to enter lattices. It was confirmed that Ag, Cr, Mn, Sn, Pb, Mo In and Se enter lattices.

Elements to fill lattice defects are not limited to one kind, but plural kinds of elements can be filled simultaneously. In an experiment performed by the inventors, the crystallization speed was improved remarkably by, for example, filling Sn (or Pb) in lattices when the material is Ge—Sb—Te based material or Ge—Bi—Te based material. The repeatability was improved by fang Cr in lattices. Therefore, the crystallization speed and repeatability were improved at the same time by filling Sn (or Pb) together with Cr. Similar effects were obtained by filling Mn in place of Cr in the crystal lattices. Filling Ag was helpful in improving optical reflectance variation between a crystalline phase and an amorphous phase (improvement in recording signal amplitude). Therefore, improvement in the recording signal amplitude and the crystallization speed was achieved simultaneously by adding Ag and Sn (or Pb) together. Signal amplitude and repeatability were improved simultaneously by filling Ag and Cr (or Mn) at the same time. The addition of Sn (or Pb), Ag and Cr (or Mn) together served to improve crystallization speed, signal amplitude and repeatability simultaneously.

Figure 2:
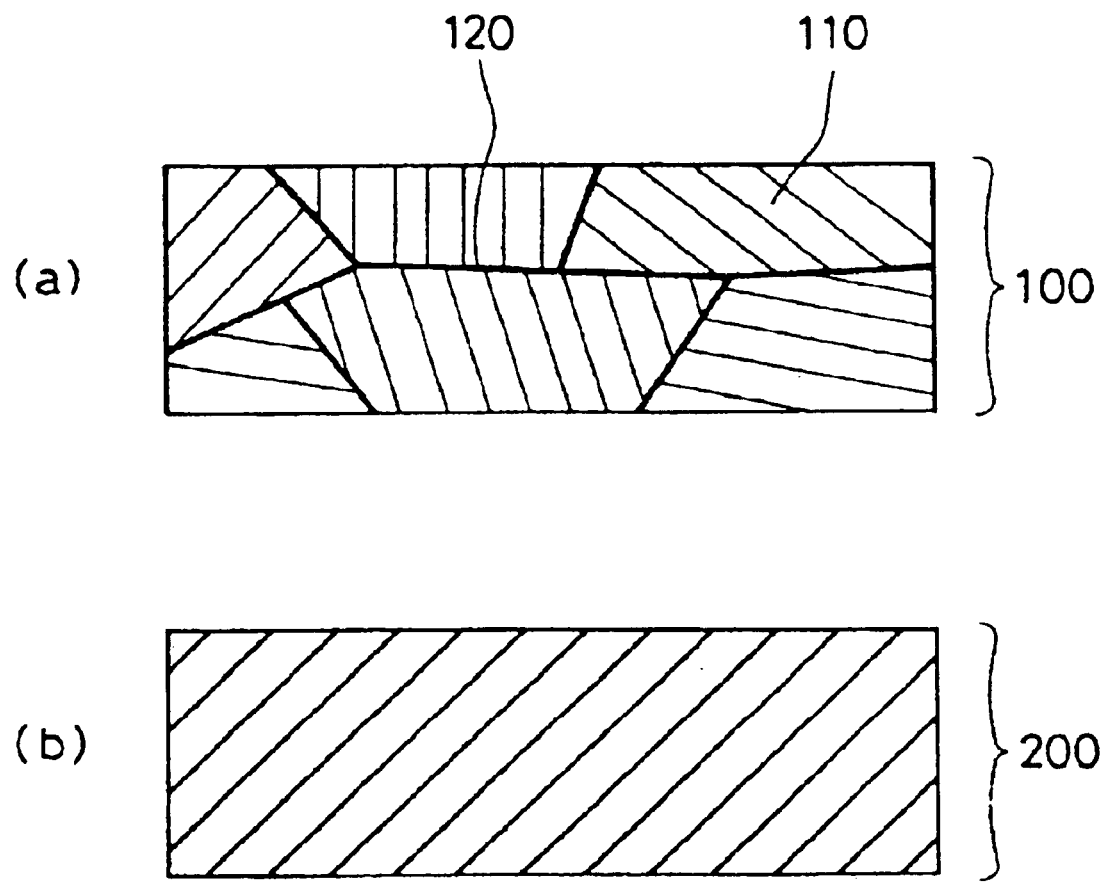
FIG. 2 is a schematic view to show a structure (atom position at a time of crystallization) of another representative recording film used for an information recording medium of the present invention, in which the recording layer is a complex phase (a crystalline phase).
Figure 4A:
FIGS. 4A–4J are cross-sectional views of an example of a layer constitution of an optical information recording medium according to the present invention.
Figure 4B:
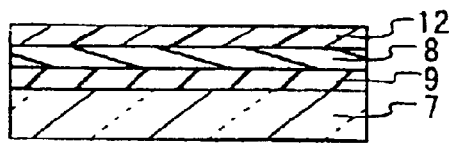
Figure 4C:
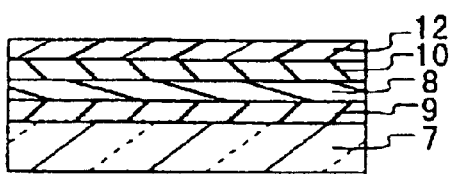
Figure 4D:
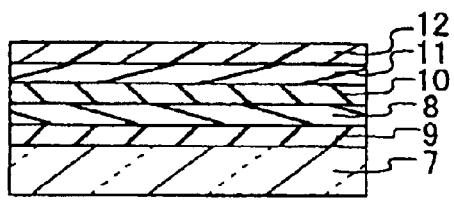
Figure 4E:
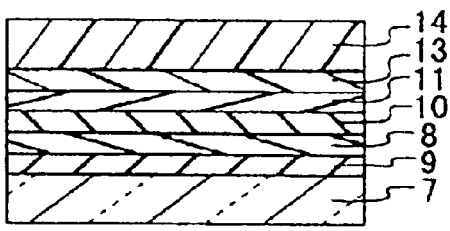
Figure 4F:
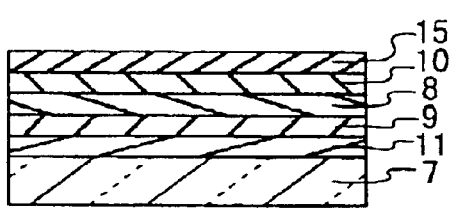
Figure 4G:
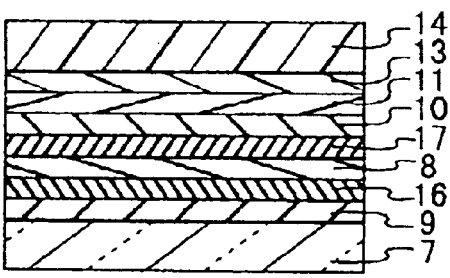
Figure 4H:
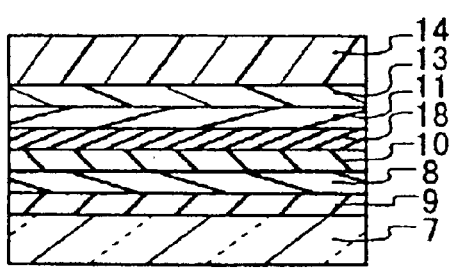
Figure 4I:
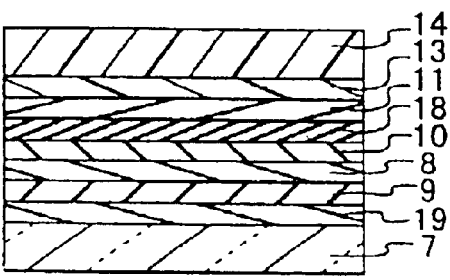
Figure 4J:
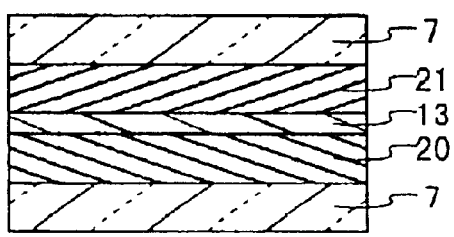
Figure 5:
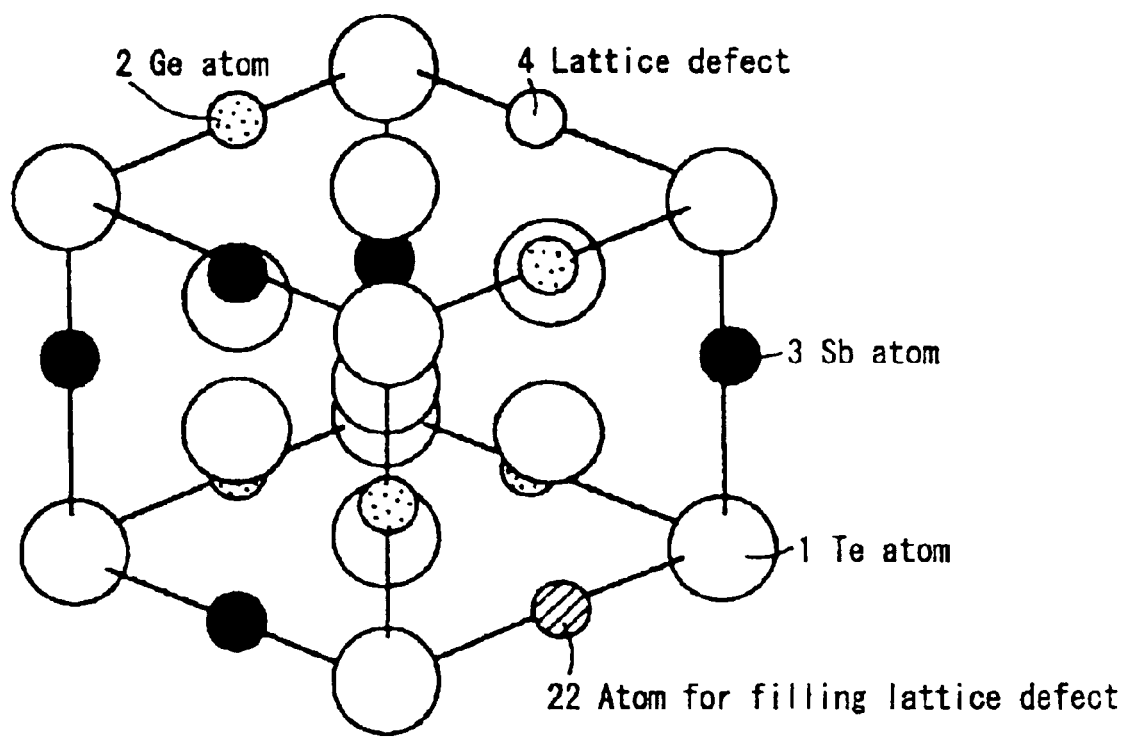
FIG. 5 is a schematic view of a crystal structure to show positions of additional elements in the crystalline phase of a recording film used for an information recording medium according to the present invention. Numeral 22 denotes a position of an atom filling a lattice defect in a rock-salt type crystal lattice.

FIG. 2 indicates a preferred embodiment for a recording layer used for another optical information recording medium according to the present invention. FIG. 2 expresses schematically a partial microscopic structure of a recording layer 8 at a laser irradiation part in any of FIGS. 4A–4I. In FIG. 2, (a) denotes a crystalline phase (complex phase) 100 comprising a mixture of a compound component 110 and an amorphous component 120, while (b) denotes a single-amorphous phase 200. The recording material layer is composed of the four elements, of Ge, Sb, Te and Sn. The crystal component 110 in the complex phase 100 has a NaCl type structure comprising the four elements of Ge—Sb—Te—Sn. The 4a sites of the NaCl type structure (sites corresponding to Cl) are occupied by Te, while the 4b sites (sites corresponding to Na) are occupied randomly by Ge, Sb and Sn. At the 4b sites there are lattice defects to accept no atoms, which tends to decrease entire density. As a result, volume variation between the crystalline phase and amorphous phase is decreased, and inconvenience such as deformation or perforation caused by the phase change is prevented. In the grain boundary, components that cannot enter the lattices exist in an amorphous state. Here, Sb exists in an amorphous state. It is preferable that an amount of the amorphous component is twice or less than the crystal component by number of molecules. It is preferable $A/C \leq 2$, or more preferably, $A/C \leq 1$, where C denotes a number of molecules of the crystal component and A denotes a number of molecules of the amorphous component. When the ratio of the amorphous component exceeds twice, the crystallization speed will be lowered remarkably. On the other hand, when the ratio is close to 0, the crystallization speed is increased excessively. It is preferable that $A/C \geq 0.01$. The element that is found as an amorphous component in the crystalline phase is not limited to Sb but it can be Ge. Ge is effective in raising crystallization temperature or improving repeatability. The great viscosity of the amorphous Ge is considered to provide such effects. It has been confirmed that elements such as Mn and Cr can be added for depositing Ge.

From a macroscopic viewpoint, all elements are arranged in a substantially uniform state in the single-amorphous phase 200. It is important for the recording film to change reversibly between the two states during recording or rewriting information. At this time, it is preferable that a part of the elements for forming the amorphous phase 120 and elements for forming the compound component 110 in the complex phase 100 is common, so that the distance of atomic diffusion is decreased at the time of phase change so as to complete the change rapidly. It is effective also in preventing generation of great positional compositional segregation when rewriting is repeated many times.

A material layer composing the recording layer comprises a material for forming a crystalline phase in a complex phase, and the material is represented by a format of Ma-Mb-Mc-α, in which Ma comprises Ge and at least one of Sn and Pb, Mb comprises at least one of Sb and Bi, and Mc comprises at least one of Te and Se. Any other elements can be added if required. For example, Mn, Cr, Ag, Al, In or the like can be added. For a material for forming an amorphous phase in the complex phase, Sb or Ge is suitable for a Ge—Sb—Te based material, while Ge or Bi is suitable for a Ge—Bi—Te based material. For a AgInSbTe based material, In can be used.

In general, protective layers 9 and 10 in FIGS. 4B–4I are made of a dielectric material. Protective layers suggested as optical disk media in conventional techniques can be used as well. The examples include a material layer of an oxide alone or a complex oxide of an element selected from Al, Mg, Si, Nb, Ta, Ti, Zr, Y, and Ge; a material layer of a nitride or a nitride-oxide of an element selected from Al, B, Nb, Si, Ge, Ta, Ti, and Zr; a sulfide such as ZnS and PbS; a selenide such as ZnSe; a carbide such as SiC; a fluoride such as $CaF_2$ and LaF; and a mixture thereof such as $ZnS$—$SiO_2$ and $ZnSe$—$SiO_2$.

A reflecting layer 11 is based on a metal such as Au, Al, Ag, Cu, Ni, Cr, Pd, Pt, Si, and Ge, or an alloy such as Au—Cr, Ni—Cr, Al—Cr, Al—Ta, Al—Ti, Ag—Pd, Ag—Pd—Cu, Si—W, and Si—Ta.

An overcoat layer 12 can be made of, for example, a photo-curable resin. An adhesive 13 can be made of, for example, a hot-melt adhesive or a photo-curable resin such as an ultraviolet curable resin. A protective plate 14 can be made of the same material as the substrate. The substrate is not transparent necessarily for a constitution to record and reproduce by irradiating a laser beam from the side having a recording layer. The above-mentioned mentioned substrate can be replaced by, for example, a plate of a light metal such as Al and Cu, or a plate of alloy based on the light metal, and a plate of ceramics such as $Al_2O_3$ and $MgO_2$. In this case, the respective layers are formed on the substrate in a reversed order.

Though it is not indispensable, a surface layer 15 can be provided on the outermost in order to prevent damage caused by a contact with an optical head. The surface layer can be made of a lubricant material comprising e.g., a diamond-like-carbon and a polymer material.

Interface layers 16 and 17 can be formed in an interface between the recording layer and at least one of the protective layers for several purposes, such as preventing atomic diffusion in spacing between the recording layer and the protective layer. Especially, nitrides, nitride-oxides and carbides are suitable for the interface layer. The examples include materials of Ge—N—(O), Al—N—(O), Si—C—N, Si—C or the like, and materials further including Cr, Al or the like, such as Ge—C—N and Si—Al. Optical absorption Aa of a recording layer in an amorphous state can be decreased relatively with respect to optical absorption Ac of the recording layer in a crystalline state by applying an optical absorption layer 18 over an upper protective layer of the recording layer, or by applying a semitransparent reflecting layer 19 at the light incident side of the recording layer.

The optical absorption layer can be made of alloy materials based on Si and Ge, or alloy materials based on Te. The reflecting layer can be made of the same material, or it can be formed by laminating dielectric films having different refractive indices, such as $SiO_2/ZnS$—$SiO_2/SiO_2$. An alternative medium can have both surfaces made by adhering a recording medium having these multilayer films 20 and 21 through adhesive layers 13.

A multilayer film used for an optical information recording medium according to the present invention can be formed by an ordinary method for forming a thin film. The method is selected, for example, from magnetron sputtering, DC sputtering, electron beam deposition, resistance heating deposition, CVD, and ion plating. Especially, magnetron sputtering using an alloy target, and also DC sputtering are excellent in obtaining uniform films that will be used as recording films in the present invention. A target used for sputtering contains a main component of a material for forming the above-mentioned rock-salt structure, to which an element for filling the lattice defects is added. Such a target can be prepared by solidifying powders composed of respective elements at a proper ratio, and the elements are, for example, Ge, T, Sb and Al; Ge, Sb, Sn, Cr and Te; Ge, Sb, Te, Sn and Ag. Though the component ratio in the target substantially corresponds to compositions of the recording film, minor adjustment for every apparatus is required since the components will be influenced by the apparatus. For example, Dad is equal substantially to $Dim \leq Ddf \times 1.5$, where Dim denotes a concentration of an additive in a film of the crystalline phase, Ddf denotes a concentration of lattice defects, and Dad denotes a concentration of an additive in a target. In general, an amorphous single phase is formed just after film formation, which will be transformed into a crystalline phase (initialization). It is possible to form a phase as a mixture of the crystalline phase and the amorphous phase by irradiating with a high density energy flux. In irradiation of the high density energy flux, it is desirable to penetrate the flux at a high temperature for a short period. Therefore, laser irradiation and flash irradiation are used suitably.

Figure 10:
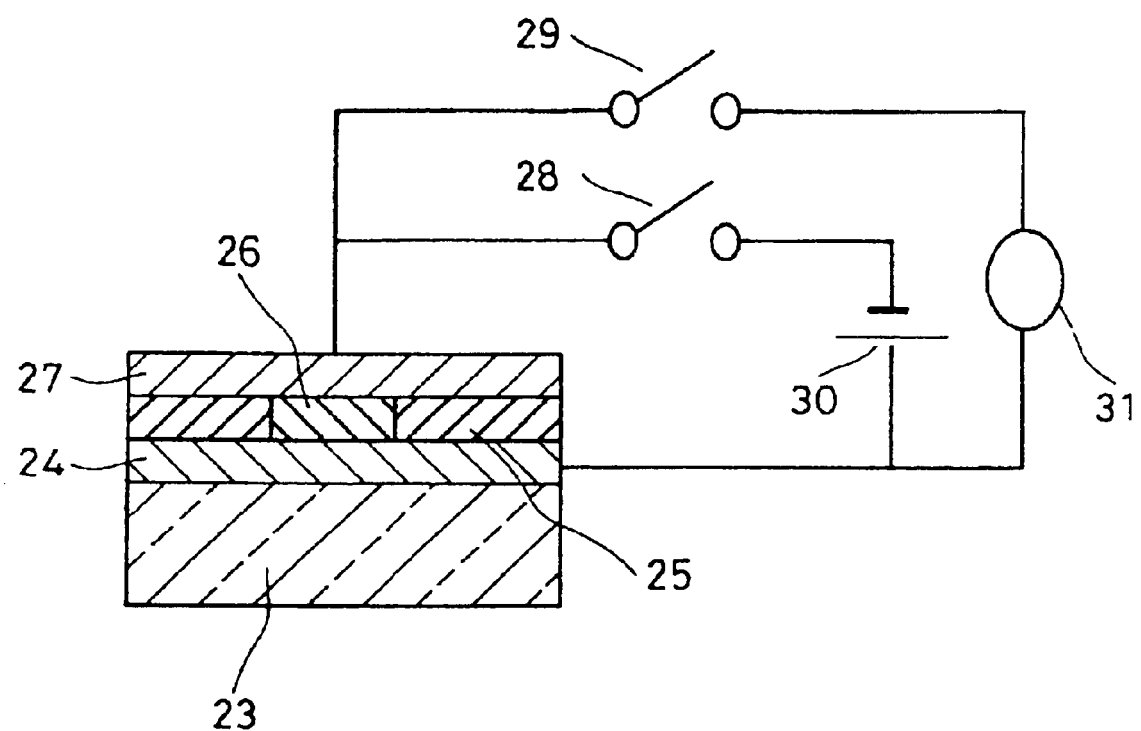
FIG. 10 is a schematic view to show a basic structure of an electric memory device (a reversible change memory of a resistor) according to the present invention.

FIG. 10 is a schematic view to show a basic structure of an electric memory device according to the present invention (a reversible change memory of a resistor). In FIG. 10, 23 is a substrate selected from a glass sheet, a ceramic sheet such as $Al_2O_3$, and sheets of various metals such as Si and Cu. The following explanation is about a case for using an alumina substrate. In FIG. 10, an Au layer is sputtered to provide an electrode 24 on a substrate. Subsequently, a layer 25 of an insulator such as $SiO_2$ or SiN is formed thereon through a metal mask, and further, a recording layer 26 comprising a phase change material similar to the above-mentioned recording layer for the optical information recording medium, and also an electrode (Au) 27 are laminated. Between the electrodes 24 and 27, a pulse power source 30 is connected through a switch 28. For crystallizing the recording film that is in highly resistant under as-depo.-condition in order to change into a low resistant state, the switch 28 closes (switch 29 open) so as to apply voltage between the electrodes. The resistance value can be detected with a resistance meter 31 while opening the switch 28 and closing the switch 29. For reversely transforming from the low resistant state to a high resistant state, voltage higher than the voltage at the time of crystallization is applied for the same or shorter period of time. The resistance value can be detected with a resistance meter 31 while opening the switch 28 and closing the switch 29. A large capacity memory can be constituted by arranging a large number of the memory devices in a matrix.

The present invention will be described further by referring to specific examples.

Example 1

Example 1 is directed to a method for manufacturing an optical information recording medium according to the present invention. A substrate used in this example was a disc-shape polycarbonate resin substrate that was 0.6 mm in thickness, 120 mm in diameter and 15 mm in inner diameter. A spiral groove was formed substantially on the whole surface of the substrate. The track was a concave-convex groove having a depth of 70 nm. Both the groove portion and the land portion of the track had a width of 0.74 μm. A multilayer film would be formed on the surface later. A laser beam for recording/reproducing an information signal can move to an arbitrary position on the disk by a servo signal provided from the concave-convex shape. On the substrate, the following layers were formed in this order: a ZnS:20 mol % $SiO_2$ protective layer 150 nm in thickness; a $Ge_2Sb_2Te_5Al_{0.5}$ thin film 20 nm in thickness; a GeN interface layer 5 nm in thickness; a ZnS:20 mol % $SiO_2$ protective layer 40 nm in thickness; and an $Al_{97}Cr_3$ alloy reflecting plate 60 nm in thickness. The protective layers were prepared by magnetron sputtering using a ZnS—$SiO_2$ sintered target and Ar sputtering gas. The recording layer and the reflecting layer were prepared by DC sputtering in which respective alloy targets and Ar sputtering gas were used. The interface layer was formed by a reactive magnetron sputtering using a Ge target and a sputtering gas as ax mixture of Ar gas and $N_2$ gas. In any cases, $N_2$ gas can be added to a sputtering gas. After completing the film formation, an ultraviolet curable resin was spin-coated, and a polycarbonate plate the same as a substrate was adhered to serve as a protective plate, and this was irradiated by a ultraviolet beam lamp subsequently for curing, before subjecting the disk to an initial crystallization by irradiating a laser beam. The thus obtained optical information recording medium can record and reproduce by means of laser irradiation. In an inspection with an X-ray diffraction, the part that was subjected to the initial crystallization was a NaCl type single-crystalline phase having Al in the crystal lattices, though a slight halo peak was observed. The same inspection was carried out for the other additive elements, and similar results were observed for Mn, Ag, Cr, Sn, Bi, and Pb.

Example 2

On a quartz substrate, eight kinds of thin film material were formed by DC sputtering. The materials were represented by $Ge_2Sb_2Te_5Al_X$, in which A1:x=0.0, A2:x=0.2, A3:x=0.5, A4:x=1.0, A5:x=1.5, A6:x=2.0, A7:x=2.5, and A8:x=3.0. The base vacuum degree was $1.33\times10^{-4}$ Pa, and Ar was introduced to make the vacuum degree to be $1.33\times10^{-1}$ Pa. Under this condition, 100 W power was applied between a cathode and an alloy target of 100 mmΦ in diameter so as to form a thin film having a thickness of 20 nm. These samples were monitored by using a He—Ne laser beam in the varying strength of the transmitted light while being heated at a programming rate of 50° C./minute in order to measure a temperature at which transmittance was decreased remarkably as a result of crystallization. The results are shown in Table 3.

The increase of the crystallization temperature becomes sharp when the Al concentration is at a level of the sample A5. For this composition, Ddf (concentration of lattice defects) occupies 10% of the whole sites (20% of the 4b sites). For the respective samples, ratios that A1 atoms fill lattice defects to Ddf are as follows: A1:0, A2:0.2×Ddf, A3:0.5×Ddf, A4:1.0×Ddf, A5:1.5×Ddf, A6:2.0×Ddf, A7:2.5×Ddf, and A8:3.0×Ddf. For the samples A5–A8, there are more A1 atoms than the lattice defects to be filled. Percentage of the A1 atoms to the whole compositions in the respective samples are as follows. A1:0%, A2:2.2%, A3:5.3%, A4:10%, A5:14.3%, A6:18.2%, A7:21.7%, and A8:25%.

Regarding the samples A3 and A4a Rietveld method was performed to identify the structures in detail by using an X-ray diffractometry so as to confirm that Al entered the crystal sites in any of the samples. FIG. 6 is a schematic view to show such a sample. The probability that the lattice defects are filled with the additives is determined randomly as well. For the samples A5, A6, A7 and A8, excessive atoms that cannot enter the crystal lattices will exist among the crystal particles. Such excessive atoms are not always Al, but other elements such as Sb or Ge may deposit as a result of substitution with Al. Laser irradiation period for causing crystallization would be extended when the Al concentration is increased. In the Table, ◎ indicates that crystallization occurred within 70 ns, ○ indicates that crystallization occurred within 100 ns, Δ indicates that crystallization occurred within 200 ns, and x indicates that crystallization required more than 200 ns. When an effective optical spot length is represented by $1/e^2$, an ideal value would be about 0.95 μm since an optical system used for the current DVD-RAM has a wavelength of 660 nm, and NA of an objective lens is 0.6. It takes about 160 ns for the laser spot to traverse a disk rotating at a linear velocity of 6 m/s, which corresponds to a velocity for DVD-RAM. Therefore, a disk with a ○ mark can be applied to a current DVD-RAM system. It can be applied to a system having a linear velocity of at least 9 m/s as well. A disk with ◎ mark can cope with an even higher linear velocity of at least 12 m/s.

Example 3

Eight optical disks from a1 to a8 were prepared by using the compositions of Example 2 in the method of Example 1. These disk media were rotated at a linear velocity of 9 m/s, and light beams having a wavelength of 660 nm emitted from a laser diode were focused on the disks by using an optical system comprising an object lens having NA of 0.6.

TABLE 3

Relationship between Al concentration in a $Ge_2Sb_2Te_5$ thin film and crystallization temperature · crystallization speed

| | Sample | | | | | | | |
|---|---|---|---|---|---|---|---|---|
| | A1 | A2 | A3 | A4 | A5 | A6 | A7 | A8 |
| Al con.[1] | 0% | 2.2% | 5.3% | 10% | 14.8% | 18.2% | 21.7% | 25% |
| $T_A$ | 180° C. | 183° C. | 189° C. | 200° C. | 227° C. | 255° C. | 305° C. | 350° C. |
| $T_{ay}$ | ◎ | ◎ | ◎ | ◎ | ○ | Δ | X | X |

Figure 6A:
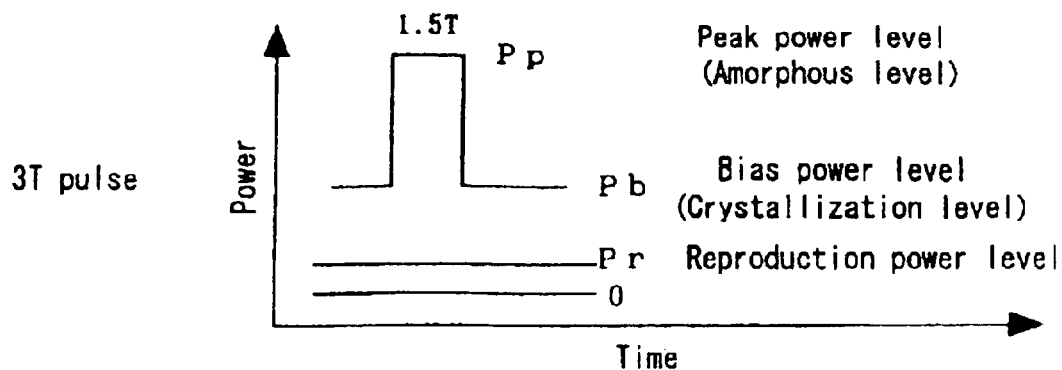
FIGS. 6A–6C are graphs to show laser modulation waveforms to evaluate the recording performance of an optical information recording medium according to the present invention.
Figure 6B:
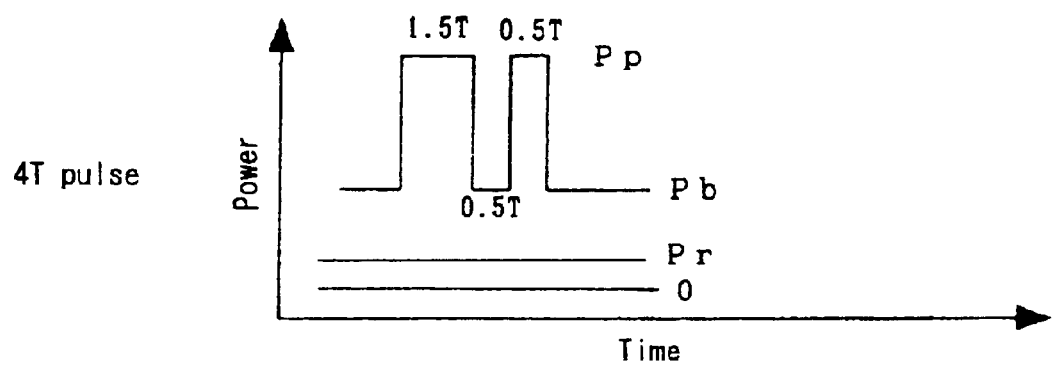
Figure 6C:
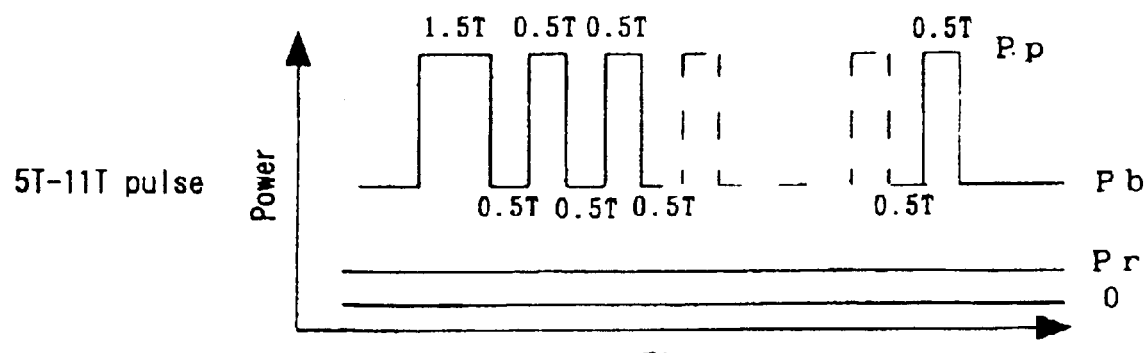

At this time, as shown in FIGS. 6A–6C, overwriting recording was carried out in a 8–16 modulation (bit length: 0.3 μm) by applying a multi-pulse waveform corresponding to waveforms of signals ranging from a 3T signal to a 11T signal. The peak power and bias power were determined as follows. First, a power to provide an amplitude of −3 dB to a saturation value of the amplitude was obtained and the power was multiplied by 1.3 to provide a peak power. Next, the peak power was fixed while the bias power was determined to be variable for conducting 3T recording. 11T recording was conducted with the same power for measuring a damping ratio of the 3T signal, which was established as an erasing rate. Since the erasing rate was increased gradually, experienced a substantially flat region and turned into decrease, the bias power was determined to be a central value of the upper limit power and a lower limit power with an erasing rate of more than 20 dB.

Table 4 shows recording power (peak power/bias power) at a time of land recording for each disk, CIN, a maximum value for elimination rate, and a number of times that a jitter value is 13% or less when random signals are overwrite-recorded repeatedly.

TABLE 4

Relationship between Al concentration in $Ge_2Sb_2Te_5$ thin film and disk performance

| | Disk | | | | | | | |
|---|---|---|---|---|---|---|---|---|
| | a1 | a2 | a3 | A4 | a5 | a6 | a7 | a8 |
| Al con. | 0% | 2.2% | 5.3% | 10% | 14.3% | 18.2% | 21.7% | 25% |
| Power mW | 10.5/ 4.5 mW | 10.5/ 4.5 mW | 10.5/ 4.5 mW | 10.5/ 4.5 mW | 10.1/ 4.6 mW | 10.0/ 4.9 mW | — | — |
| C/N | 50 dB | 51.5 dB | 52 dB | 52.5 dB | 52.5 dB | 52.5 dB | 52.0 dB | — |
| Erasing rate | 25 dB | 30 dB | 34 dB | 35 dB | 29 dB | 21 dB | 10 dB | — |
| NT | 3 × $10^4$ | 1 × $10^5$ | >1 × $10^5$ | >1 × $10^6$ | 1 × $10^6$ | 2 × $10^4$ | — | — |

[1]: Al concentration
[2]: Number of times

The results show that addition of Al improves erasing rate and increases a number of repetitions. When the Al concentration was not higher than a concentration (10%) of the lattice defects, erasing rates exceeded 30 dB and the repetition numbers exceeded 100,000 for any of the disks a2, a3, and a4. It was found that optimum values were obtained for CIN, erasing rate and repetition number when the Al concentration matches the concentration Ddf of the lattice defects. High-speed crystallization performance was maintained up to the time that the Al concentration became 1.5 times of the lattice defect concentration. For the disk a5, the repetition number was increased when compared to a disk including no additives. When the additive concentration is increased excessively, the crystallization velocity is lowered and thus, the erasing rate is decreased and the jitter becomes large. For the disks a7 and a8, the jitter was over 13% from the initial stage. It was observed for these disks having improved repeatability that mass transfer was restrained.

Example 4

Various disks were manufactured by determining the composition of the recording film in Example 1 to be $(Gee)_x(Sb_2Te_3)_{1-x}$, where the x value was varied in a range from 0 to 1. For every disk, $D_1$ and $D_2$ were measured. $D_1$ denotes a proper range of Al concentration, and $D_2$ denotes an optimum range among $D_1$. The concentration was determined first to be 0.2% and 0.5% and subsequently, it was increased by 0.5%, i.e., 1%, 1.5%, 2%. 2.5% . . . The proper range was determined to be a concentration range to provide a repetition number larger than that of a disk including no additives, and the determination was based on the methods described in Examples 2 and 3. The optimum range was a concentration range in which the repetition number was doubled at least when compared to a disk including no additives and a range that a high crystallization velocity was obtainable. Namely, it is a range to allow crystallization by irradiating a laser beam for 150 ns at most.

TABLE 5

Optimum Al addition concentration for $(GeTe)_x(Sb_2Te_3)_{1-x}$

| X value | Ddf for NaCl structure | Al concentration within proper range:D1 | Al concentration within optimum range:D1 | Notes |
|---|---|---|---|---|
| 0 | 16.7% | — | — | $Sb_2Te_3$ itself |
| 0.1 | 16.1% | 0.2% ≤ D1 ≤ 24.0% | 3.0% ≤ D2 ≤ 16.0% | |
| 0.2 | 15.4% | 0.2% ≤ D1 ≤ 23.0% | 3.0% ≤ D2 ≤ 15.0% | |
| 0.33 | 14.3% | 0.2% ≤ D1 ≤ 22.0% | 3.0% ≤ D2 ≤ 14.0% | $GeSb_4Te_7$ |
| 0.5 | 12.5% | 0.2% ≤ D1 ≤ 19.5% | 2.0% ≤ D2 ≤ 12.5% | $GeSb_2Te_4$ |
| 0.67 | 10.0% | 0.2% ≤ D1 ≤ 16.0% | 1.5% ≤ D2 ≤ 11.0% | $Ge_2Sb_2Te_5$ |
| 0.8 | 7.1% | 0.2% ≤ D1 ≤ 11.5% | 0.5% ≤ D2 ≤ 8.5% | |
| 0.9 | 4.2% | 0.2% ≤ D1 ≤ 6.5% | 0.2% ≤ D2 ≤ 4.5% | |
| 0.91 | 3.8% | 0.2% ≤ D1 ≤ 6.0% | 0.2% ≤ D2 ≤ 4.0% | |
| 1 | 0% | — | — | GeTe itself |

Table 5 shows the test results. The table includes also calculation results of the concentration Ddf of lattice defects. The lattice defects are formed inevitably in a crystal structure under a hypothetical circumstance that these material thin films form metastable phases of a rock-salt type by laser irradiation. As indicated in the table, the concentration Ddf of the lattice defects increases when a $(GeTe)_x(Sb_2Te_3)$, quasibinary system composition transfers from the GeTe side to the $Sb_2Te_3$ side. On the other hand, when the proper range of Al amount reaches a range higher than a range for the defect concentration, the range up to about 1.5×Ddf is effective in improving the characteristics.

Figure 7:
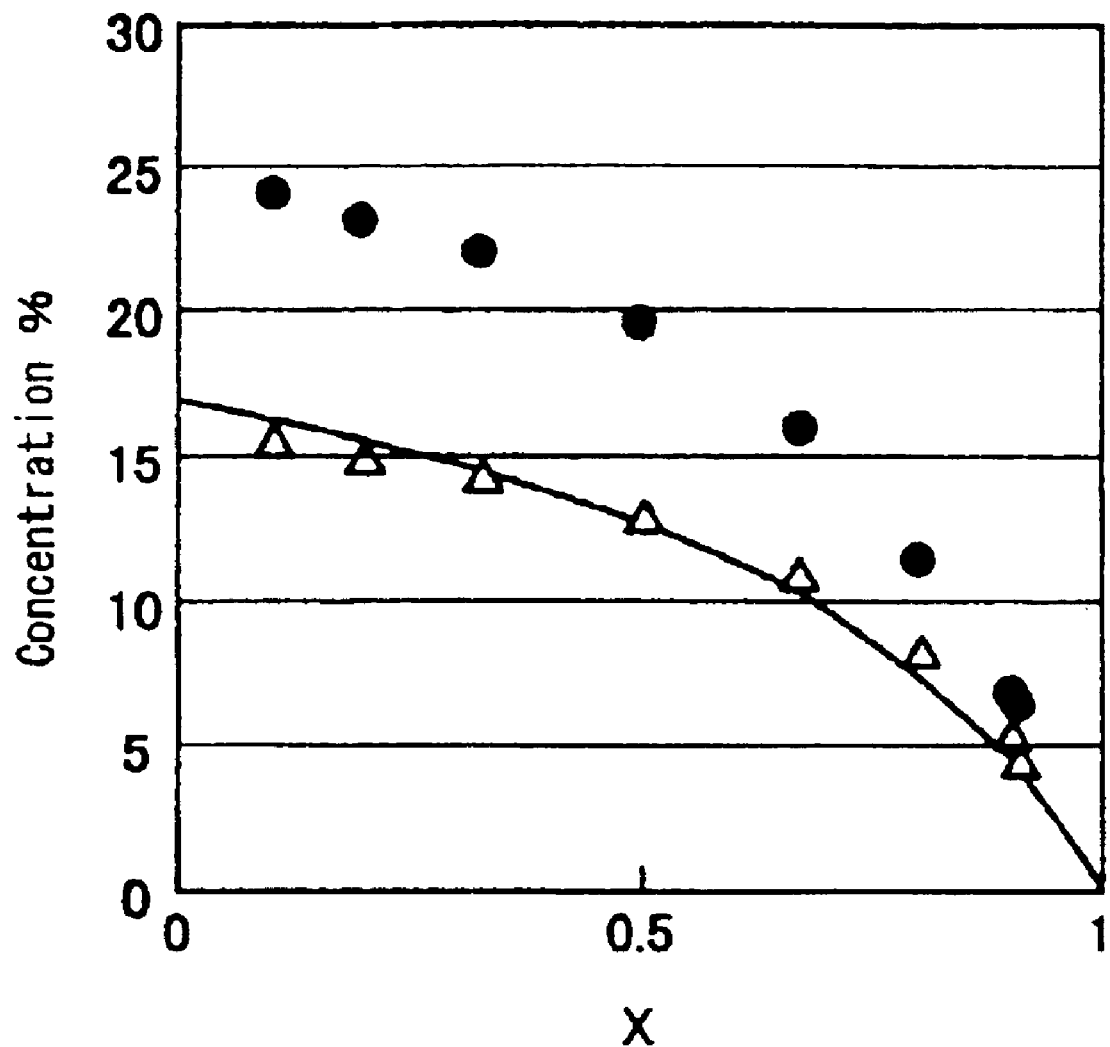
Figure 8A:
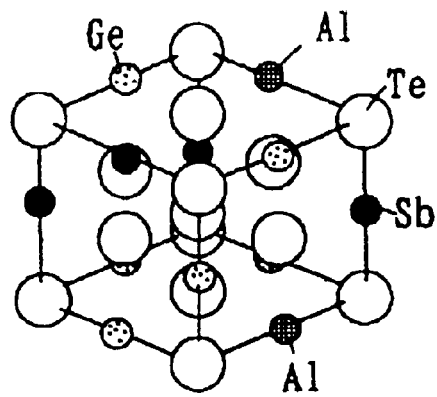
FIGS. 8A–8F and 9A–9E show examples of crystal structures of recording films used for information recording media according to the present invention. The respective structures will cope with any compound phases shown in FIGS. 1 and 2.
Figure 8B:
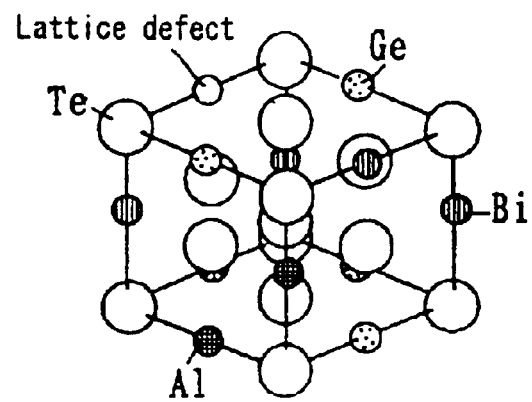
Figure 8C:
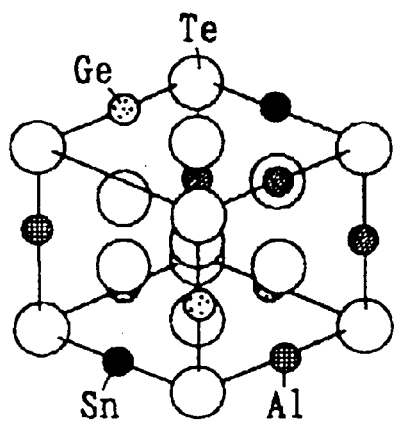
Figure 8D:
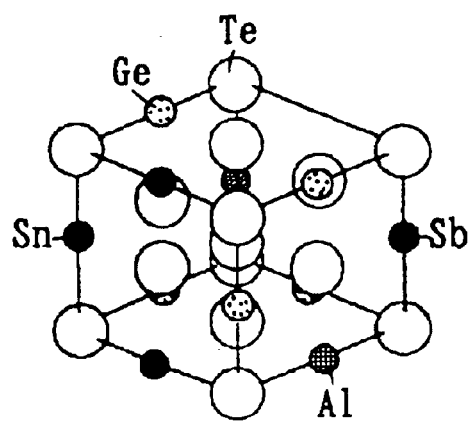
Figure 8E:
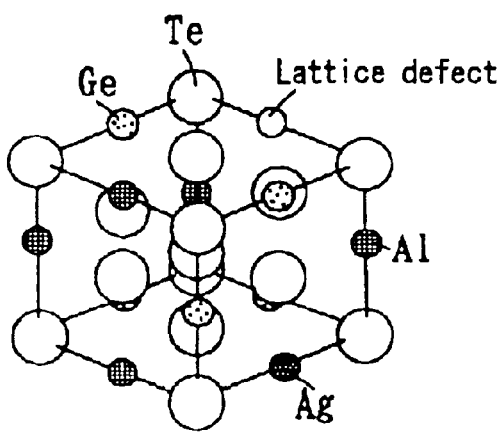
Figure 8F:
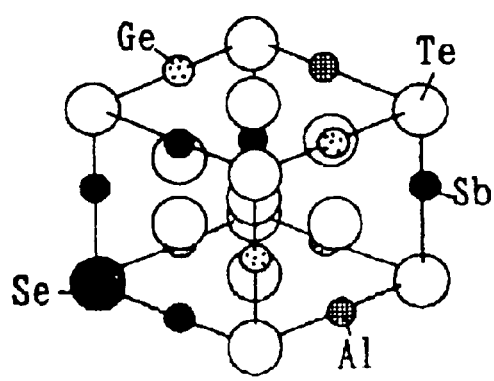
Figure 9A:
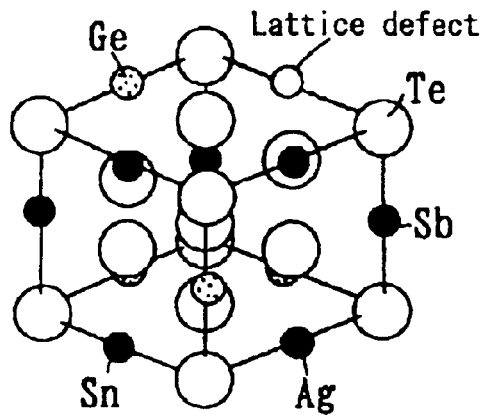
Figure 9B:
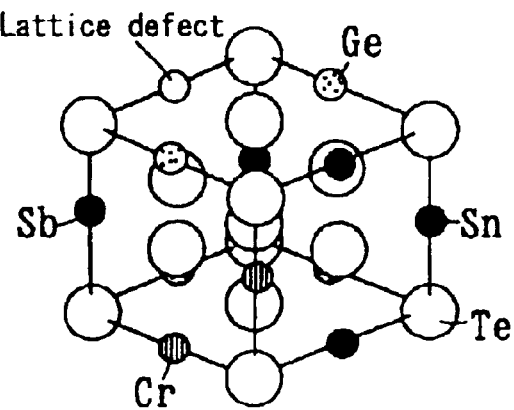
Figure 9C:
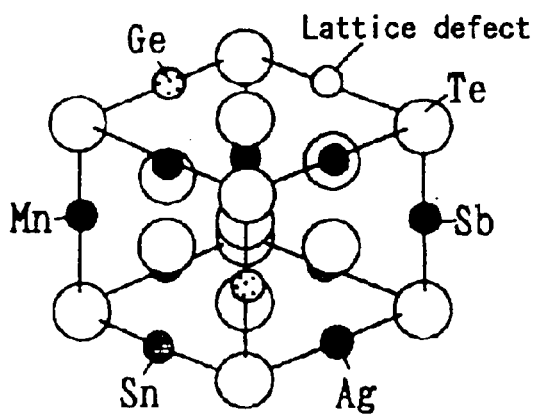
Figure 9D:
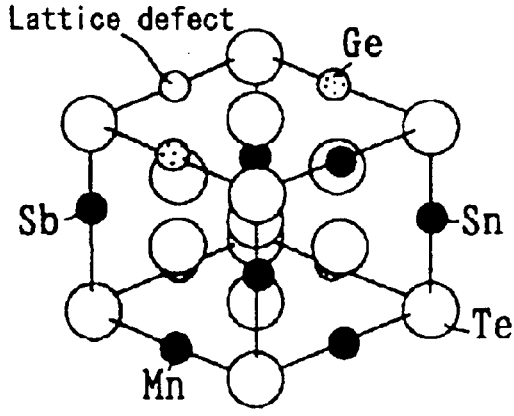
Figure 9E:
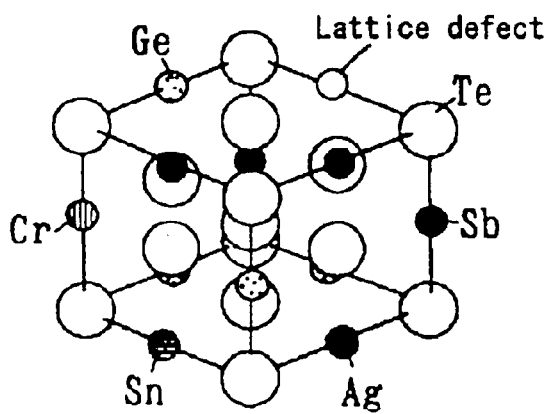

FIG. 7 is a graph to show the relationships. The solid line denotes Ddf, while ● denotes the upper limit of the proper range and Δ denotes the upper limit of the optimum range. The upper limit of the optimum range substantially coincides with the Ddf value while the x value is small and Ddf absolute value is big. However, the upper limit will be bigger than Ddf by about 20% when the x value is increased and Ddf value is decreased. The reason can be estimated as follows. Since a part of the Al additive is modified due to oxidization, nitriding or the like, a percentage for entering the crystal lattices is lowered, and thus, the amount of the additive should be increased.

Example 5

Disks of Example 4 were subjected to 10000 times of overwrite-recording of a single frequency signal having a mark length of 0.3 μm before a measurement of the CN ratio. Subsequently, the disks were kept in a thermostat at a temperature of 90° C. and humidity of 80% RH for 200 hours and the CN ratio of the same track was measured. The results are shown in Table 6. In the table, ⊚ indicates that the initial CN ratio was at least 50 dB and a decrease in the CN ratio was at most 1 dB even after a 200 hours of acceleration test. ○ indicates that the initial CN ratio was at least 50 dB and a decrease in the CN ratio was at most 3 dB after a 100 hours of acceleration test. Δ indicates that the initial CN ratio was at least 50 dB while the CN ratio was decreased by at least 3 dB in the acceleration test. x indicates that problems occurred during the initial overwriting of 10000 times, e.g., the CN ratio was decreased.

TABLE 6

Result of acceleration test of disks based on $(GeTe)_x(Sb_2Te_3)_{(1-x)}$ containing Al

| | X | | | | | | | | | |
|---|---|---|---|---|---|---|---|---|---|---|
| | 0 | 0.1 | 0.2 | 0.33 | 0.5 | 0.67 | 0.8 | 0.9 | 0.91 | 1 |
| Result | Δ | Δ | ○ | ○ | ⊚ | ⊚ | ⊚ | ⊚ | x | x |

Example 6

A similar test was carried out by changing the composition of the recording film of Example 4 to $(GeTe)_x(Bi_2Te_3)_{1-x}$. Similar results were obtained for the effects caused by the Al addition and the proper concentration.

Example 7

A similar test was carried out by changing the composition of the recording film of Example 4 to $(GeTe)_x(M_2Te_3)_{1-x}$ (M: a mixture comprising Sb and Bi at an arbitrary ratio). Similar results were obtained for the effects caused by the Al addition and the proper concentration.

Example 8

Disks having films with varied N concentration were prepared by varying partial pressures of Ar gas and $N_2$ gas, in which the recording layers were formed by adding 7% Al to $(GeTe)_{0.8}(Sb_2Te_3)_{0.2}$. The concentration of N in the films was identified by using SIMS. The thus obtained disks were subjected to recording of random signals having a bit length of 0.26 μm under a condition that the recording power was 11 mW (peak power)/5 mW (bias power) and the linear velocity was 9 m/s in order to examine the overwriting characteristics. The evaluation results are shown in Table 7.

Table 7 indicates that addition of N improves recording sensitivity. When excessive N was added, the optical constant was reduced and C/N was lowered. The effects became apparent when 0.5% of N was added, and the preferable amount of N was about 5%.

TABLE 7

Relationship between N concentration in recording thin film and disk performance

| | Disks | | | | | | | |
|---|---|---|---|---|---|---|---|---|
| | A | B | C | D | E | F | G | H |
| N con. | 0% | 0.1% | 0.5% | 1% | 3% | 5% | 10% | 20% |
| C/N | 51.0 dB | 51.0 dB | 52.0 dB | 52.0 dB | 52.5 dB | 52.5 dB | 49.5 dB | 45.0 dB |
| Power mW | 11.5/ 5.0 mW | 11.4/ 4.9 mW | 11.1/ 4.6 mW | 10.8/ 4.4 mW | 10.5/ 4.1 mW | 10.0/ 4.0 mW | 10.0/ 4.2 mW | 10/ 4.4 mW |

N con.: N concentration

Example 9

Various additives other than Al were added to $Ge_2Sb_2Te_5$ recording films for the purpose of examining the recording performance of the films. Additives were selected from elements having ion radii similar to an ionic radius of Al, i.e., V, S, Si, P, Se, Ge, Mn, Re, Co, Te, Cr, Ni; elements having melting points similar to that of Al, i.e., Sb, Pu, Mg, Ba; and elements of a separate group, i.e., Ag, Pb, and Sn. Each additive of about 5 atom % was added for examining the effects.

Disks were manufactured in accordance with Examples 1 and 3 in order to examine the overwriting repeatability. Even if an element had an ion radius value similar to that of Al, the element often caused phase separation during repetition when the melting point is far from that of Al. For an element having a melting point similar to that of Al, degradation occurred due to mass transfer as a result of repetition if the ion radius value was far apart from that of Al. When Pb or Sn was added, both the repeatability and crystallization speed were improved, while the crystallization temperature lowered to some degree. When Ag was added, the signal amplitude was improved, and the repetition number was increased slightly. In conclusion, a maximum repetition number was obtained for a disk including an additive having an ion radius and a melting point similar to that of Al.

Example 10

Various additives were added to $Ge_3Al_2Te_5$ recording films for the purpose of examining the recording performance of the film. For the additives, Sn, Pb and Ag were selected, since these elements will form a rock-salt type crystal structure with Te (SnTe, PbTe, $AgSbTe_2$) in a thermally equilibrium state. Concentrations of the respective elements were 5% and 8.5%. Disks were manufactured in accordance with Examples 1 and 3 for examining the laser crystal portions to find 9 rock-salt type crystal of a single phase. In an examination on the overwriting repeatability, no mass transfer occurred even after 10000 times of repetition.

FIG. 8A–8F and FIGS. 9A–9E show crystal structures for representative examples in Examples 10 and 11. In the drawings, only some of the structures include lattice, defects which indicates that lattice defects are formed depending on the compositions. Te or Se atoms occupy the 4a sites while the other atoms and lattice defects (vacancy) occupy the 4b sites. The atoms occupy the respective sites at random and the rate is influenced by the composition.

Example 11

A recording film was formed in which Sb of Example 4 was replaced by Al. The composition of the recording film was $(GeTe)_x(Al_2Te_3)_{(1-x)}$ (x=0.67, 0.8). The recording film was irradiated with a laser beam so as to obtain a metastable single phase. In an evaluation Of the disk performance, overwrite-recording at a linear velocity of 9 m/s was achieved. Recording sensitivity was increased by about 10% in disks comprising the composition together with 3 atom % of Sb or Bi.

Example 12

In accordance with Example 1, various (100 kinds) optical disks were manufactured in which the composition is represented by $[(Ge+Sn)_4Sb_2Te_7]_{(100-y)}Cr_y$. In the composition, x indicates a percentage of Sn in the entire composition and y indicates atom %. The values of x and y were varied in the following range:

x=0, 1, 2, 3, 4, 5, 8, 10, 15, 20%
y=0, 1, 2, 3, 4, 5, 8, 10, 15, 20%.

A substrate used in this example is a disc-shape polycarbonate resin substrate that is 0.6 mm in thickness, 120 mm in diameter and 15 mm in inner diameter. A spiral groove was formed on substantially the whole surface of the substrate. The track was a concave-convex groove having a depth of 70 nm. Both the groove portion and the land portion of the track had a width of 0.615 μm. A multilayer film would be formed on the surface. A laser beam for recording/reproducing an information signal can move to an arbitrary position on the disk by a servo signal obtained from the concave-convex shape. On the substrate, the following layers were formed in this order: a ZnS:20 mol % $SiO_2$ protective layer 100 nm in thickness; a GeN-based interface layer 5 nm in thickness; a recording layer 9 nm in thickness having the above-identified composition; a GeN interface layer 5 nm in thickness; a ZnS:20 mol % $SiO_2$ protective layer 40 nm in thickness; a Ge-based or Si-based alloy layer 40 nm in thickness; and an Ag-based metal reflecting layer 80 nm in thickness. The disk characteristics were evaluated on three criteria, i.e., signal volume, repetition number, and stability of rewriting sensitivity (after an environmental test at 80° C., 90% RH for 200H). In an evaluation carried out by taking a disk of y=0 and z=0 as a standard, the crystallization speed was increased with an increase of Sn concentration, while excessive Sn decreased stability of an amorphous state. When Cr concentration was increased, the crystallization speed and signal amplitude were lowered and rewriting sensitivity was lowered due to an environmental test, while the stability of the amorphous state and repetition number were increased. It was confirmed that equivalent or better performance was obtainable for all the three criteria when the Sn concentration was in a range from 3% to 15% and the Cr concentration was in a range from 1% to 10%. It was effective especially in improving both the repetition number and the stability of rewiring sensitivity when the Sn concentration was in a range from 5% to 10% and the Cr concentration was in a range from 1% to 5%.

Example 13

In accordance with Example 12, 100 kinds of optical disks were manufactured in which the composition is represented by $[(Ge+Sn)_4Sb_2Te_7]_{(100-z)}Ag_z$. In the composition, x indicates a percentage of Sn in the entire composition and z indicates atom %. The values of x and z were varied in the following range:

x=0, 1, 2.3, 4.5, 8, 10, 15, 20%
z=0, 1, 2, 3, 4, 5, 8, 10, 15, 20%.

The thickness of the respective layers and evaluation criteria are identical to those of Example 12. It was confirmed that crystallization speed was raised with an increase of Sn concentration, but stability of an amorphous state deteriorated when the concentration was increased excessively. It was confirmed also that increase of Ag concentration increased signal size, though excessive Ag lowered the repeatability.

It was confirmed that equivalent or better performance was obtainable for all the three criteria in a comparison with a case where no additives were included, when the Sn concentration was in a range from 3% to 15% and the Ag concentration was in a range from 1% to 10%. It was effective especially in improving both the signal amplitude and the stability of rewiring sensitivity when the Sn concentration was in a range from 5% to 10% and the Ag concentration was in a range from 1% to 3%.

Example 14

In accordance with Examples 12 and 13, 1000 kinds of optical disks were manufactured in which the composition is represented by $[(Ge+Sn)_4Sb_2Te_7]_{(100y-z)}Cr_yAg_z$. In the composition, x indicates a percentage of Sn in the entire composition and y and z indicate atom %. The values of x, y and z were varied in the following range:

x=0, 1, 2, 3, 4, 5, 8, 10, 15, 20%
y=0, 1, 2, 3, 4, 5, 8, 10, 15, 20%
z=0, 1, 2, 3, 4, 5, 8, 10, 15, 20%.

The thickness of the respective layers and evaluation criteria are identical to those of Examples 12 and 13. It was confirmed that equivalent or better performance was obtainable for all the three criteria when the Sn concentration was in a range from 3% to 15%, the Cr concentration was in a range from 1% to 5%, and the Ag concentration was in a range from 1% to 10%. It was effective especially in improving signal amplitude, stability of rewiring sensitivity and repeatability when the Sn concentration was in a range from 5% to 10%, the Cr concentration was in a range from 1% to 3%, and the Ag concentration was in a range from 1% to 3%.

Example 15

Similar results were obtained in an evaluation in accordance with Examples 12, 13 and 14, where Cr was replaced by Mn.

Example 16

The tests of Examples 12, 13, 14, and 15 were carried out after replacing the base material by a $(GeTe)_x(Sb_2Te_3)_{(1-x)}$ quasibinary system material (0<x<1) and a $GeTe$—$Bi_2Te_3$ quasibinary system material (0<x<1), and similar effects were obtained. Particularly, when $0.5<x\leq 0.9$, both the repeatability and amorphous stability were obtainable. The Sn concentration was preferably ½ or less of the Ge concentration in the base material, since the amorphous phase stability deteriorates when the Sn concentration exceeds the limitation.

Example 17

On a 0.6 mm thick polycarbonate substrate, a $Ge_{19}Sn_{2.1}Sb_{26.3}Te_{52.6}$ (atom %) thin film having a thickness of 1 μm was formed by sputtering. The whole surface of the film was irradiated with a laser beam for crystallization, and subsequently, an x-ray diffraction pattern was observed and the structure was analyzed by a Rietveld method (a method to identify by measuring several model substances and comparing the substances with a target substance) and a WPPF (whole-powder-peak-fitting) method. It was confirmed that the film comprised a NaCl type crystalline phase and amorphous phase, and that there were about 20% of lattice defects at the 4b sites. The above-identified thin film composition can be represented by $(Ge+Sn)_2Sb_{2.5}Te_5$, in which about 0.5 mol of the 2.5 mol Sb cannot enter the lattices and the excessive Sb will be deposited as an amorphous component. At that time, the molar ratio (r) of the composition of the amorphous phase to that of the crystalline phase was about 0.5/1=0.5. In a test where the Sb concentration was varied on a basis of the composition, crystallization characteristics were kept experimentally when 'r' was 2.0 or less. When 'r' was 1.0 or less, the crystallization speed would be increased further.

Example 18

Similar analysis was carried out by varying the composition of recording films in Example 17. Table 8 shows the test results. The right column in the table indicates speed of crystallization caused by laser irradiation. The mark ⊙ indicates that the time for crystallization is 100 ns or less. ○ indicates that the time is 200 ns or less, Δ denotes that the time is 500 ns or less and x denotes the time exceeds 500 ns. A recording film with a mark ○ will be applied preferably to recent systems, however, a recording film with a mark Δ also can be applied to the systems. As indicated in the table, all of these compositions include lattice defects inside thereof, and one phase forms a complex phase comprising a NaCl type crystalline phase and an amorphous phase. When a ratio 'r' of the amorphous phase to the crystalline phase in the complex phase is 1 or less, high speed crystallization is available. Crystallization will be difficult when the ratio 'r' exceeds 2.

TABLE 8

Compositions and structures of materials and crystallization performance

| No. | Total composition | Structure of complex phase | Lattice defect | r | Crystallization performance |
|---|---|---|---|---|---|
| 1 | $Ge_3Sb_{2.5}Te_6$ | NaCl type crystalline phase 1 mol + Sb amorphous phase 0.5 mol | 16% | 0.5 | ⊙ |
| 2 | $Ge_3Bi_{2.8}Te_6$ | NaCl type crystalline phase 1 mol + Bi amorphous phase 0.8 mol | 16% | 0.8 | ⊙ |
| 3 | $GeSb_{2.5}Bi_2Te_7$ | NaCl type crystalline phase 1 mol + Sb + Bi amorphous phase 0.5 mol | 28% | 0.5 | ⊙ |
| 4 | $Ge_3SnBi_{2.7}Te_7$ | NaCl type crystalline phase 1 mol + Sb amorphous phase 0.7 mol | 16% | 0.7 | ⊙ |
| 5 | $Ge_2Sb_2Cr_{0.3}Te_5$ | NaCl type crystalline phase 1 mol + Sb amorphous phase 0.3 mol | 20% | 0.3 | ⊙ |
| 6 | $GeSb_2In_{0.2}Te_4$ | NaCl type crystalline phase 1 mol + Sb amorphous phase 0.1 mol | 25% | 0.2 | ⊙ |
| 7 | $GePb_{0.1}Bi_2Te_4$ | NaCl type crystalline phase 1 mol + Bi amorphous phase 0.1 mol | 25% | 0.1 | ⊙ |
| 8 | $GeSb_{2.2}Se_{0.1}Te_{3.9}$ | NaCl type crystalline phase 1 mol + Sb amorphous phase 0.2 mol | 20% | 0.2 | ⊙ |
| 9 | $Ge_{3.5}Sn_{0.01}Sb_3Te_7$ | NaCl type crystalline phase 1 mol + Sb amorphous phase 0.01 mol | 16% | 0.01 | ⊙ |
| 10 | $Ge_{3.5}Sn_{0.1}Sb_{3.5}Te_7$ | NaCl type crystalline phase 1 mol + Sb amorphous phase 0.3 mol | 16% | 0.3 | ⊙ |
| 11 | $Ge_{3.5}Sn_{0.5}Sb_3Te_7$ | NaCl type crystalline phase 1 mol + Sb amorphous phase 1.0 mol | 16% | 1.0 | ⊙ |
| 12 | $Ge_{3.5}Sn_{0.5}Sb_{3.5}Te_7$ | NaCl type crystalline phase 1 mol + Sb amorphous phase 1.5 mol | 16% | 1.5 | ○ |
| 13 | $Ge_{3.5}Sn_{0.5}Sb_4Te_7$ | NaCl type crystalline phase 1 mol + Sb amorphous phase 2.0 mol | 16% | 2.0 | Δ |
| 14 | $Ge_{3.5}Sn_{0.5}Sb_{4.5}Te_7$ | NaCl type crystalline phase 1 mol + Sb amorphous phase 2.5 mol | 16% | 2.5 | X |

Example 19

A polycarbonate disk substrate having a diameter of 120 mm and thickness of 0.6 mm was prepared, and a continuous groove 60 nm in depth and 0.6 μm in width was formed on the surface. On this disk substrate, a multilayer film comprising the recording films of Nos. 9–18 in Example 18 was formed in a predetermined order by sputtering, a protective plate was adhered by using an ultraviolet curing resin, and subsequently, the recording layers were crystallized by means of laser irradiation. Each multilayer film structure has six layer lamination on a substrate, and the layers are $ZnS$—$SiO_2$:20 mol % layer 90 nm in thickness, a Ge—N layer 5 nm in thickness, a recording layer 20 nm in thickness, a Ge—N layer 5 nm in thickness, a ZnS—SiO$_2$:20 mol % layer 25 nm in thickness, and an Al alloy layer 100 nm in thickness.

A deck for evaluating the disk characteristics comprises an optical head equipped with a red semiconductor laser having a wavelength of 650 nm and an object lens having NA of 0.6. The rotation velocity of each disk was varied to find the linear velocity range where recording and erasing (overwriting) were available. Modulation frequencies (f1 and f2) were selected so that recording marks would be 0.6 μm and 2.2 μm under any linear velocity conditions, and recording was carried out alternately in order to find repeatability based on the CIN and the erasing rate. In Example 19, the recording portion was the groove. DC erasing was carried out after the recording. The results are shown in Table 9. The linear velocity demonstrated in Table 9 is the upper limit of linear velocity allowing the CIN that has been amorphous-recorded at f1 to exceed 48 dB and at the same time, the DC erasing rate (crystallization) of a f1 signal to exceed 25 dB.

Table 9 shows that applicable range of linear velocity can be selected continuously in an arbitrary manner in accordance with change of the r value. Under each maximum linear velocity condition, any disks provided excellent repeatability of more than 10000 times.

TABLE 9

Material composition and limitation of applicable linear velocity

| No. | Composition | R | Repetition number | Linear velocity limit |
|---|---|---|---|---|
| 9 | Ge$_{3.5}$Sn$_{0.01}$Sb$_3$Te$_7$ | 0.01 | >500,000 | 50.0 m/s |
| 10 | Ge$_{3.5}$Sn$_{0.1}$Sb$_{3.5}$Te$_7$ | 0.3 | >500,000 | 30.0 m/s |
| 11 | Ge$_{3.5}$Sn$_{0.3}$Sb$_3$Te$_7$ | 1.0 | 300,000 | 10.0 m/s |
| 12 | Ge$_{3.5}$Sn$_{0.5}$Sb$_{3.5}$Te$_7$ | 1.5 | 100,000 | 3.0 m/s |
| 13 | Ge$_{3.5}$Sn$_{0.5}$Sb$_4$Te$_7$ | 2.0 | 50,000 | 1.0 m/s |
| 14 | Ge$_{3.5}$Sn$_{0.5}$Sb$_{4.5}$Te$_7$ | 2.5 | 10,000 | 0.3 m/s |

Example 20

An apparatus as shown in FIG. 10 was assembled. In Example 20, a Si substrate having a nitrided surface was prepared. An electrode of Au having a thickness of 0 μm was provided on the substrate by sputtering and subsequently, a SiO$_2$ film having a thickness of 100 nm was formed thereon through a metal mask provided with a circular hole 0.5 mm in diameter. Next, a (Ge$_3$Sn$_1$Sb$_7$Te$_7$)$_{95}$Cr$_5$ film was formed thereon to have a thickness of 0.5 μm, an Au electrode was sputtered to have a thickness of 0.5 μm, and the respective electrodes were bonded to Au leads. By applying 500 mV voltage between these electrodes for a period of a pulse width of 100 ns, the device transformed from a high resistant state to a low resistant state. When this device was charged with current of 100 mA for a period of a pulse width of 80 ns in the next step, the state of the device was reversed from the low resistant state to a high resistant state.

INDUSTRIAL APPLICABILITY

As mentioned above, the present invention provides an optical information recording medium having a recording thin film. The recording medium having a recording thin film exhibits little variation of the recording and reproduction characteristics even after repetition of recording and reproduction, excellent weatherability. The present invention provides also a method of manufacturing the information recording medium. The present invention provides a recording medium having a recording thin film that has strong resistance against composition variation and easily controllable characteristics.

What is claimed is:

1. An information recording medium comprising a substrate and a recording material layer formed on the substrate, the recording material layer undergoing reversible phase change between electrically or optically detectable states by electric energy or by electromagnetic energy, wherein
   the recording material layer comprises a material selected from a material 'A' having a crystal structure comprising a lattice defect in one phase of the reversible phase change; or a material 'B' in a complex phase composed of a crystal portion comprising a lattice defect and an amorphous portion in one phase of the reversible phase change, and the crystal portion and the amorphous portion comprise a common element;
   at least a part of the lattice defect is filled with an element other than an element constituting the crystal structure,
   the crystal structure comprising the lattice defect comprises Ge, Sb and Te,
   the crystal structure comprising the lattice defect further comprises at least one element selected from Sn, Cr, Mn, Ag, Al, Pb, In and Se, and
   the crystal structure comprising the lattice defect further comprises at least one combination of elements selected from Sn—Cr, Sn—Mn, Sn—An, Mn—Ag, Cr—Ag, Sn—Mn, and Sn—Cr—Ag.

2. The information recording medium according to claim 1, wherein a molar ratio of the amorphous portion to the crystalline portion in the complex phase of the material 'B' is 2.0 at most.

3. The information recording medium according to claim 1, wherein the reversible phase change of the material 'B' occurs between the complex phase and a single phase.

4. The information recording medium according to claim 1, wherein the crystal structure comprising the lattice defect is a NaCl type.

5. The information recording medium according to claim 1, wherein the crystal structure comprising the lattice defect comprises Te or Se.

6. The information recording medium according to claim 1, wherein the amorphous phase portion composing the complex phase of the material 'B' comprises at least one element selected from Sb, Bi, Ge and In.

7. The information recording medium according to claim 1, wherein the crystal structure comprising the lattice defect optionally comprises Bi, and the amorphous component in the complex phase comprises at least one element selected from Ge, Sb and Bi.

8. The information recording medium according to claim 1, wherein the element to fill at least a part of the lattice defect forms a stoichiometric rock-salt type crystal that is gable with respect to Te.

9. The information recording medium according to claim 1, satisfying a relationship represented by 0.7 Rnc<Rim≦1.05 Rnc, where Rim denotes an ionic radius of an element filling at least a part of the lattice defect, and Rnc denotes a minimum value of an ionic radius of an element constituting the crystal sectors.

10. The information recording medium according to claim 1, satisfying a relationship represented by |Tim−Tnc|≦500° C. where Tim denotes a melting point of an element filling at least a part of the lattice defect, and Tnc denotes a melting point of a crystal constituting the crystal structure.

11. The information recording medium according to claim 1, satisfying a relationship represented by 0.7 Rnc<Rim≦1.05 Rnc and |Tim−Tnc|≦100° C., where Rim denotes an ionic radius of an element filling at least one part of the lattice defect, Tim denotes the melting point, Rnc denotes a minimum value of an ionic radius of an element constituting the crystal structure, and Tnc denotes the melting point.

12. The information recording medium according to claim 1, satisfying a relationship represented by Dim≦Ddfx 1.5, where Dim denotes a concentration of an element added to fill the lattice defect, and Ddf denotes a concentration of the lattice defect in the crystal structure.

13. The information recording medium according to claim 12, wherein the Dim satisfies a relationship represented by 0.2≦Dim≦Ddf.

14. The information recording medium according to claim 8, wherein the element to fill the lattice defect is at least one element selected from Ag, Sn and Pb.

15. The information recording medium according to claim 8, wherein the crystal structure comprising the lattice defect is a GeTe—$Sb_2Te_3$ quasibinary system composition.

16. The information recording medium according to claim 15, wherein the element to fill the lattice defect is Al.

17. The information recording medium according to claim 15, wherein the crystal structure comprising the lattice defect comprises $(GaTe)_{(1-x)}(M_2Te_3)_x$ where M denotes Sb and optionally an element selected from Bi, Al, and an arbitrary mixture of Sb, Bi, and Al; and x satisfies 0.2≦x≦0.9.

18. The information recording medium according to claim 17, wherein x satisfies 0.5≦x≦0.9.

19. The information recording medium according to claim 1, fiber comprising N in the recording film.

20. The information recording medium according to claim 19, wherein a concentration Dn of the N atom (atom %) is in a range of 0.5≦Dn≦5.

21. An information recording medium comprising a substrate and a recording, material layer formed on the substrate, the recording material layer undergoing reversible phase change between electrically or optically detectable states by electric energy or by electromagnetic energy, wherein
the recording material layer comprises a material selected from a material 'A' having a crystal structure comprising a lattice defect in one phase of the reversible phase change; or a material 'B' in a complex phase composed of a crystal portion comprising a lattice defect and an amorphous portion in one phase of the reversible phase change, and the crystal portion and the amorphous portion comprise a common element; and
at least a part of the lattice defect is filled with an element other than an element constituting the crystal structure;
wherein the element to fill at least a part of the lattice defect forms a stoichiometric rock-salt type crystal that is stable with respect to Te;
the crystal structure comprising the lattice defect is at least a group of elements selected from a GeTe—$Sb_2Te_3$ quasibinary system composition, a GeTe—$Bi_2Te_3$ quasibinary system composition, and a GeTe—$Al_2Te_3$ quasibinary system composition, and
the crystal structure comprising the lattice defect comprises $(GeTe)_{(1-x)}(M_2Te_3)$ where M denotes an element selected from Sb, Bi, Al, and an arbitrary mixture of Sb, Bi, and Al; and x satisfies 0.2≦x≦9.

22. The information recording medium according to claim 21, wherein a molar ratio of the amorphous portion to the crystalline portion in the complex phase of the material 'B' is 2.0 at most.

23. The information recording medium according to claim 21, wherein the reversible phase change of the material '1' occurs between the complex phase and a single phase.

24. The information recording medium according to claim 21, wherein the crystal structure comprising the lattice defect is a NaCl type.

25. The information recording medium according to claim 21, wherein the crystal structure comprising the lattice defect comprises Te or Sc.

26. The information recording medium according to claim 21, wherein the amorphous phase portion composing the complex phase of the material 'B' comprises at least one element selected from Sb, Bi, Ge and In.

27. The information recording medium according to claim 21, wherein the crystal structure comprising the lattice defect comprises Ge, Sb and Te.

28. The information recording medium according to claim 21, wherein the crystal structure comprising the lattice defect comprises at least one element selected from Ge, Sb, Bi and Te, and the amorphous component in the complex phase comprises at least one element selected from Ge, Sb and Bi.

29. The information recording medium according to claim 27, wherein the crystal structure comprising the lattice defect further comprises at least one element selected from Sn, Cr, Mn, Ag, Al, Pb, In and Se.

30. The information recording medium according to claim 29, wherein the crystal structure comprising the lattice defect further comprises at least one combination of elements selected from Sn—Cr, Sn—Mn, Sn—Ag, Mn—Ag, Cr—Ag, Sn—Mn, and Sn—Cr—Ag.

31. The information recording medium according to 21, satisfying a relationship represented by 0.7 Rnc<Rim≦1.05 Rnc, where Rim denotes an ionic radius of an element filling at least a part of the lattice defect, and Rnc denotes a minimum value of an ionic radius of an element constituting the crystal structure.

32. The information recording medium according to claim 21, satisfying a relationship represented by |Tim−Tnc|≦100° C. where Tim denotes a melting point of an element filling at least a part of the lattice defect, and Tnc denotes a melting point of a crystal constituting the crystal structure.

33. The information recording medium according to claim 21, satisfying a relationship represented by 0.7 Rnc<Rim≦1.05 Rnc and |Tim−Tnc|≦100° C., where Rim denotes an ionic radius of an element filling at least one part of the lattice defect, lien denotes the melting point, Rnc denotes a minimum value of an ionic radius of an element constituting the crystal structure, and Tnc denotes the melting point.

34. The information recording medium according to claim 21, satisfying a relationship represented by Dim≦Ddfx1.5, where Dim denotes a concentration of an element added to fill the lattice defect, and Ddf denotes a concentration of the lattice defect in the crystal structure.

35. The information recording medium according to claim 34, wherein the Dim satisfies a relationship represented by 0.2≦Dim≦Ddf.

36. The information recording medium according to claim 21, wherein the element to fill the lattice defect is at least one element selected from Ag, Sn and Pb.

37. The information recording medium according to claim 21, wherein the element to the lattice defect is Al.

38. The information recording medium according to claim 21, wherein x satisfies 0.5≦x≦0.9.

39. The information recording medium according to claim 21, further comprising N recording film.

40. The information recording medium according to claim 39, wherein a concentration Dn of the N atom (atom %) is in a range of 0.5≦Dn≦5.

* * * * *

UNITED STATES PATENT AND TRADEMARK OFFICE
CERTIFICATE OF CORRECTION

PATENT NO.    : 6,858,277 B2
DATED         : February 22, 2005
INVENTOR(S)   : Yamada et al.

It is certified that error appears in the above-identified patent and that said Letters Patent is hereby corrected as shown below:

Column 28,
Line 23, "Sn-Mn, Sn-An, Mn-Ag" should read -- Sn-Mn, Sn-Ag, Mn-Ag --.
Line 49, "is gable with," should read -- is stable with --.
Line 54, "crystal sectors." should read -- crystal structure --.
Line 56, "$|Tim-Tnc| \leq 500°$" should read -- $|Tim-Tnc| \leq 100°$ --.

Column 29,
Line 63, "of the material '1'" should read -- of the material 'B' --.

Column 30,
Line 42, "defect, lien denotes" should read -- defect, Rim denotes --.
Line 62, "comprising N recording" should read -- comprising N in the recording --.

Signed and Sealed this

Twenty-fourth Day of January, 2006

JON W. DUDAS
*Director of the United States Patent and Trademark Office*